(12) United States Patent
Okuda et al.

(10) Patent No.: US 12,230,538 B2
(45) Date of Patent: Feb. 18, 2025

(54) SEMICONDUCTOR DEVICE AND METHOD OF MANUFACTURING THE SAME

(71) Applicant: Kioxia Corporation, Tokyo (JP)

(72) Inventors: Shinya Okuda, Yokkaichi (JP); Kei Watanabe, Yokkaichi (JP); Kosuke Horibe, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 634 days.

(21) Appl. No.: 16/951,584

(22) Filed: Nov. 18, 2020

(65) Prior Publication Data

US 2021/0151372 A1    May 20, 2021

(30) Foreign Application Priority Data

Nov. 19, 2019   (JP) ................... 2019-208791

(51) Int. Cl.
| | | |
|---|---|---|
| *H01L 21/768* | (2006.01) | |
| *H01L 23/00* | (2006.01) | |
| *H01L 23/522* | (2006.01) | |
| *H01L 23/532* | (2006.01) | |

(Continued)

(52) U.S. Cl.
CPC .. *H01L 21/76834* (2013.01); *H01L 21/76801* (2013.01); *H01L 21/76895* (2013.01); *H01L 23/5222* (2013.01); *H01L 23/53228* (2013.01); *H01L 23/53238* (2013.01); *H01L 23/53295* (2013.01); *H01L 24/08* (2013.01); *H01L 2224/08145* (2013.01); *H10B 41/27* (2023.02); *H10B 43/27* (2023.02)

(58) Field of Classification Search
CPC ............... H01L 23/53295; H01L 21/76825
See application file for complete search history.

(56) References Cited

U.S. PATENT DOCUMENTS

| | | |
|---|---|---|
| 6,764,939 B1 | 7/2004 | Yoshitaka |
| 7,045,895 B2 | 5/2006 | Usami et al. |
| 7,102,236 B2 | 9/2006 | Ohnishi et al. |

(Continued)

FOREIGN PATENT DOCUMENTS

| | | |
|---|---|---|
| JP | 2004-253791 A | 9/2004 |
| JP | 2004-289105 A | 10/2004 |

(Continued)

OTHER PUBLICATIONS

Shaffer, E. O. et al., "Designing Reliable Polymer Coatings," Polymer Engineering And Science, vol. 36, No. 18, Sep. 1996, 7 pages.

*Primary Examiner* — Daniel Luke
(74) *Attorney, Agent, or Firm* — Oblon, McClelland, Maier & Neustadt, L.L.P.

(57) ABSTRACT

In one embodiment, the semiconductor device includes a first insulator including Si (silicon) and O (oxygen). The device further includes a first interconnect provided in the first insulator and including a metal element. The device further includes a second insulator provided on the first insulator and the first interconnect and including Si, C (carbon) and N (nitrogen), content of Si—H groups (H represents hydrogen) in the second insulator being 6.0% or less, content of Si—CH₃ groups in the second insulator being 0.5% or less. The device further includes a second interconnect provided on the first interconnect in the second insulator and including the metal element.

21 Claims, 15 Drawing Sheets

(51) Int. Cl.
  *H10B 41/27* (2023.01)
  *H10B 43/27* (2023.01)

(56) References Cited

U.S. PATENT DOCUMENTS

| | | | |
|---|---|---|---|
| 7,420,278 | B2 | 9/2008 | Tomita |
| 7,531,891 | B2 | 5/2009 | Ohto et al. |
| 7,795,133 | B2 * | 9/2010 | Nomura ............ H01L 23/53295 |
| | | | 438/622 |
| 9,330,974 | B2 * | 5/2016 | Kim ...................... H01L 23/485 |
| 10,522,468 | B2 * | 12/2019 | Ho ..................... H01L 21/76814 |
| 10,867,678 | B2 * | 12/2020 | Chen ........................ H01L 27/10 |
| 2011/0081776 | A1 * | 4/2011 | Nomura ............ H01L 21/76828 |
| | | | 438/666 |
| 2012/0007257 | A1 | 1/2012 | Nomura |

FOREIGN PATENT DOCUMENTS

| | | | |
|---|---|---|---|
| JP | 2006073569 A | * | 3/2006 |
| JP | 2006-138741 A | | 6/2006 |
| JP | 2011-82308 A | | 4/2011 |
| JP | 2015-2219 A | | 1/2015 |
| JP | 2019-160833 A | | 9/2019 |
| WO | WO 2010/064346 A1 | | 6/2010 |
| WO | WO 2010/113375 A1 | | 10/2010 |

* cited by examiner

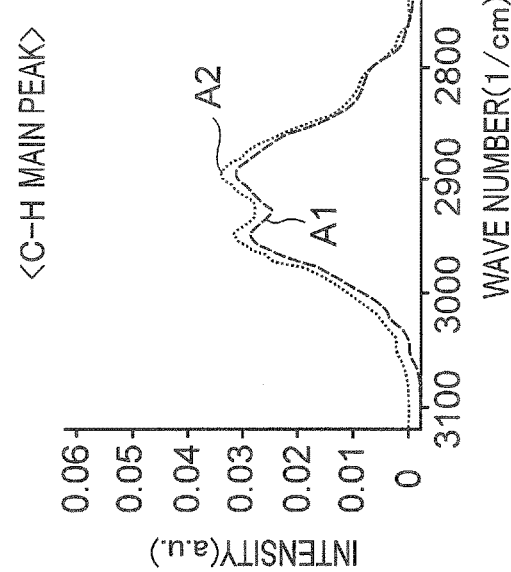
FIG. 7A
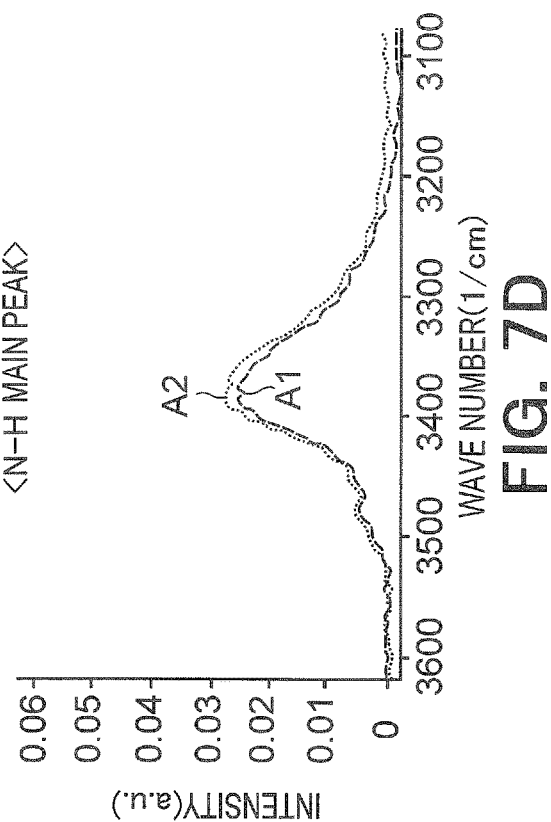
FIG. 7C
FIG. 7D
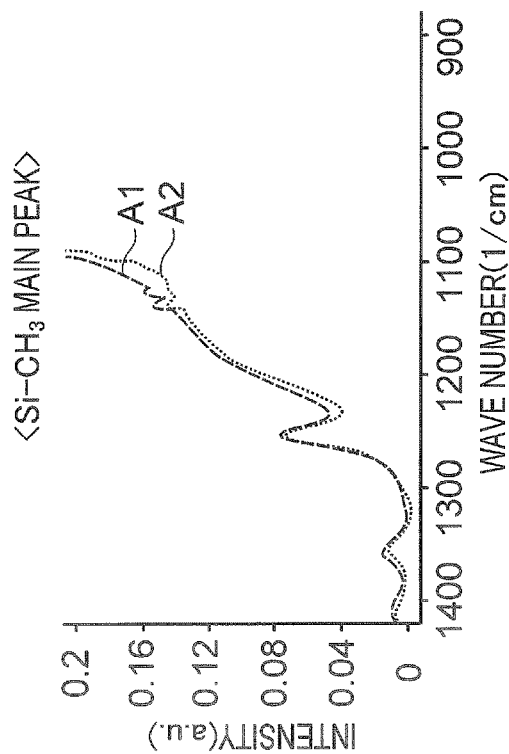
FIG. 7B
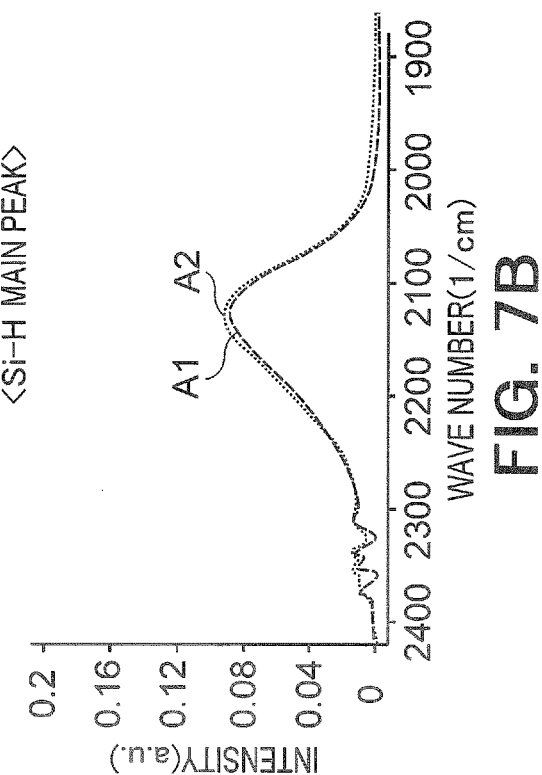

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2019-208791, filed on Nov. 19, 2019, the entire contents of which are incorporated herein by reference.

FIELD

Embodiments described herein relate to a semiconductor device and a method of manufacturing the same.

BACKGROUND

An insulator for diffusion prevention is often formed on the upper face of an interconnect to prevent metal atoms from diffusing from the interconnect. In this case, the insulator on the interconnect may show undesirable characteristics. For example, the insulator may peel from the contacting interconnect or other insulators so as to cause a crack.

BRIEF DESCRIPTION OF THE DRAWINGS

FIGS. 7A to 7D are other graphs for explaining characteristics of the SiCN film;

DETAILED DESCRIPTION

Figure 1:
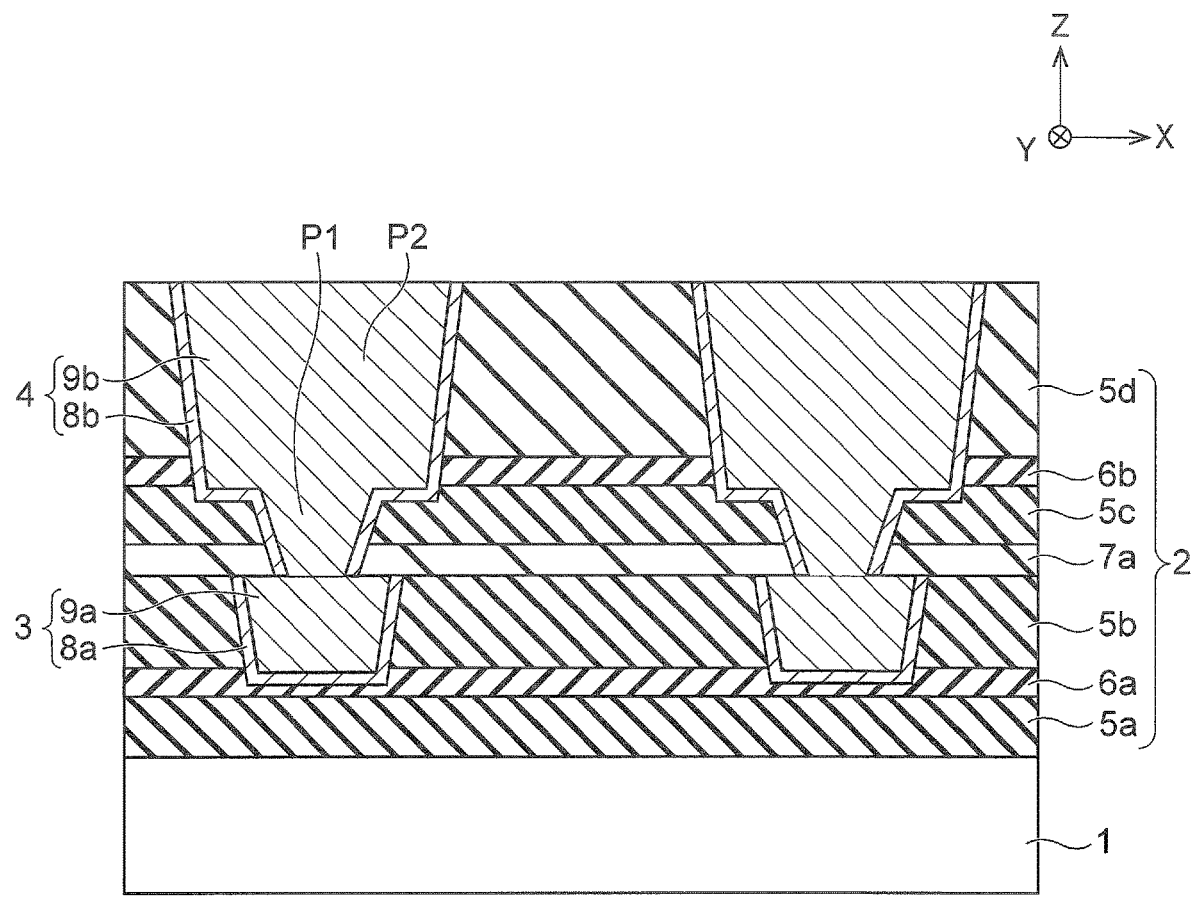
FIG. 1 is a sectional view showing the structure of a semiconductor device in a first embodiment.

In one embodiment, the semiconductor device includes a first insulator including Si (silicon) and O (oxygen). The device further includes a first interconnect provided in the first insulator and including a metal element. The device further includes a second insulator provided on the first insulator and the first interconnect and including Si, C (carbon) and N (nitrogen), content of Si—H groups (H represents hydrogen) in the second insulator being 6.0% or less, content of Si—CH$_3$ groups in the second insulator being 0.5% or less. The device further includes a second interconnect provided on the first interconnect in the second insulator and including the metal element.

Embodiments will now be explained with reference to the accompanying drawings. In FIGS. 1 to 15, the same components are denoted by the same reference numerals and signs, and redundant explanation of the components is omitted.

First Embodiment

FIG. 1 is a sectional view showing the structure of a semiconductor device in a first embodiment. The semiconductor device shown in FIG. 1 includes a substrate 1, an inter layer dielectric 2, a plurality of lower interconnects 3, and a plurality of upper interconnects 4.

The substrate 1 is, for example, a semiconductor substrate such as a Si (silicon) substrate. FIG. 1 shows an X direction and a Y direction parallel to the surface of the substrate 1 and perpendicular to each other and a Z direction perpendicular to the surface of the substrate 1. In this embodiment, a +Z direction is treated as an upward direction and a −Z direction is treated as a downward direction. The −Z direction may coincide with the gravity direction or may not coincide with the gravity direction.

The inter layer dielectric 2 includes an SiO$_2$ film (a silicon oxide film) 5a, an SiN film (a silicon nitride film) 6a, an SiO$_2$ film 5b, an SiCN film (a silicon carbide nitride film) 7a, an SiO$_2$ film 5c, an SiN film 6b, and an SiO$_2$ film 5d stacked in order on the substrate 1. The SiO$_2$ film 5b is an example of a first insulator including at least Si and O (oxygen). The SiCN film 7a is an example of a second insulator including at least Si, C (carbon), and N (nitrogen). The SiO$_2$ films 5a, 5b, 5c, and 5d, the SiN films 6a and 6b, and the SiCN film 7a may further include impurity elements such as H (hydrogen). For example, the SiO$_2$ films 5a, 5b, 5c, and 5d may include C as an impurity element. On the other hand, in this embodiment, SiC films or SiOC films may be provided in the positions of the SiO$_2$ films 5a, 5b, 5c, and 5d instead of the SiO$_2$ films 5a, 5b, 5c, and 5d.

The plurality of lower interconnects 3 are interconnects provided in the same interconnect layer. The lower interconnects 3 are examples of a first interconnect including at least a metal element. The metal element is, for example, Cu (copper). FIG. 1 illustrates two lower interconnects 3 adjacent to each other in the X direction and extending in the Y direction. In this embodiment, the lower interconnects 3 are formed on the SiN film 6a in the SiO$_2$ film 5b. The SiCN film 7a is formed on the lower interconnects 3. In this embodiment, a SiCN film may be provided in the position of the SiN film 6a instead of the SiN film 6a. The lower interconnects 3 include barrier metal layers 8a and interconnect material layers 9a.

The barrier metal layers 8a are formed on side faces of the SiO$_2$ film 5b and the upper face of the SiN film 6a. The barrier metal layers 8a are, for example, TaN films (tantalum nitride films) or TiN films (titanium nitride films). The barrier metal layers 8a are examples of a first metal layer.

The interconnect material layers 9a are formed on the side faces of the SiO$_2$ film 5b and the upper face of the SiN film 6a via the barrier metal layers 8a. The interconnect material layers 9a are, for example, Cu layers. The interconnect material layers 9a are examples of a second metal layer. The barrier metal layers 8a function to prevent Cu atoms in the interconnect material layers 9a from diffusing in the downward direction and the side direction of the interconnect material layers 9a. The SiCN film 7a functions to prevent the Cu atoms in the interconnect material layers 9a from diffusing in the upward direction of the interconnect material layers 9a. The SiCN film 7a is formed on the lower interconnects 3 to be in contact with the upper faces of the interconnect material layers 9a.

The plurality of upper interconnects 4 are interconnects provided in the same interconnect layer. The upper interconnects 4 are example of a second interconnect including at least a metal element. The metal element is, for example, Cu. The upper interconnects 4 in this embodiment are dual damascene interconnects and include plug portions P1 functioning as via plugs and interconnect portions P2 functioning as interconnect main bodies. FIG. 1 illustrates two plug portions P1 adjacent to each other in the X direction and extending in the Z direction and two interconnect portions P2 adjacent to each other in the X direction and extending in the Y direction. In this embodiment, the upper interconnects 4 are formed on the lower interconnects 3 corresponding thereto in the SiCN film 7a, the $SiO_2$ film 5c, the SiN film 6b, and the $SiO_2$ film 5d. The upper interconnects 4 include barrier metal layers 8b and interconnect material layers 9b.

The barrier metal layers 8b are formed on side faces of the SiCN film 7a, the $SiO_2$ film 5c, the SiN film 6b, and the $SiO_2$ film 5d. The barrier metal layers 8b are, for example, TaN films or TiN films. The barrier metal layers 8b may be formed on the upper faces of the lower interconnects 3 as well.

The interconnect material layers 9b are formed on the side faces of the SiCN film 7a, the $SiO_2$ film 5c, the SiN film 6b, and the $SiO_2$ film 5d via the barrier metal layers 8b and formed on the upper faces of the lower interconnects 3. The interconnect material layers 9b are directly formed on the upper faces of the lower interconnects 3 but may be formed on the upper faces of the lower interconnects 3 via the barrier metal layers 8b. The interconnect material layers 9b are, for example, Cu layers. The barrier metal layers 8b function to prevent Cu atoms in the interconnect material layers 9b from diffusing in the downward direction and the side direction of the interconnect material layers 9b. In this embodiment, SiCN films may be formed on the upper faces of the interconnect material layers 9b as well. The SiCN film functions to prevent the Cu atoms in the interconnect material layers 9b from diffusing in the upward direction of the interconnect material layers 9b.

Details of the SiCN film 7a in this embodiment are explained.

It is conceived to form an SiN film on the lower interconnects 3 in order to prevent the Cu atoms in the interconnect material layers 9 from diffusing in the upward direction of the interconnect material layers 9a. An example of such an SiN film is a P—SiN film formed by plasma CVD (Chemical Vapor Deposition). However, since the SiN film has a large dielectric constant, a problem is that the SiN film on the lower interconnects 3 increases capacitance between the lower interconnects 3 and the upper interconnects 4, capacitance between the lower interconnects 3 adjacent to each other, and capacitance between the upper interconnects 4 adjacent to each other.

Therefore, the semiconductor device in this embodiment includes the SiCN film 7a on the lower interconnects 3 instead of the SiN film. An example of such an SiCN film 7a is a P—SiCN film formed by the plasma CVD. According to this embodiment, by forming the SiCN film 7a on the lower interconnects 3, it is possible to reduce the capacitance between the lower interconnects 3 and the upper interconnects 4, the capacitance between the lower interconnects 3, and the capacitance between the upper interconnects 4 while preventing the Cu atoms in the interconnect material layers 9a from diffusing in the upward direction of the interconnect material layers 9a.

However, the SiCN film has weak adhesion to the $SiO_2$ film compared with the SiN film. Therefore, if the SiCN film 7a is formed on the lower interconnects 3, a problem is that the SiCN film 7a easily peels from the $SiO_2$ films 5b and 5c. If such peeling occurs, cracks occur in interfaces between the SiCN film 7a and the $SiO_2$ films 5b and 5c.

To form the SiCN film 7a, for example, a material gas including not only Si, C, and N but also H is used. An example of such a material gas is an $SiH(CH_3)_3$ or an $Si(CH_3)_4$ gas or an $NH_3$ gas. In this case, in general, the SiCN film 7a includes H as an impurity element and includes, for example, Si—H groups (Si—H bonds) and Si—$CH_3$ groups (Si—$CH_3$ bonds). The Si—H groups and the Si—$CH_3$ groups are considered to cause steric hindrance and deteriorate adhesion of the SiCN film 7a and the $SiO_2$ films 5b and 5c.

Therefore, in this embodiment, the SiCN film 7a having less content of the Si—H groups is formed on the lower interconnects 3. For example, the content of the Si—H groups in the SiCN film 7a is set to 6.0% or less. Consequently, it is possible to suppress the SiCN film 7a from peeling from the $SiO_2$ films 5b and 5c and suppress cracks from occurring in the interfaces between the SiCN film 7a and the $SiO_2$ films 5b and 5c.

From the same reason, in this embodiment, the SiCN film 7a having less content of the Si—$CH_3$ groups is formed on the lower interconnects 3. For example, the content of the Si—$CH_3$ groups in the SiCN film 7a is set to 0.5% or less (more preferably, 0.4% or less). Consequently, it is possible to further suppress peeling of the SiCN film 7a and occurrence of cracks.

Figure 2A:
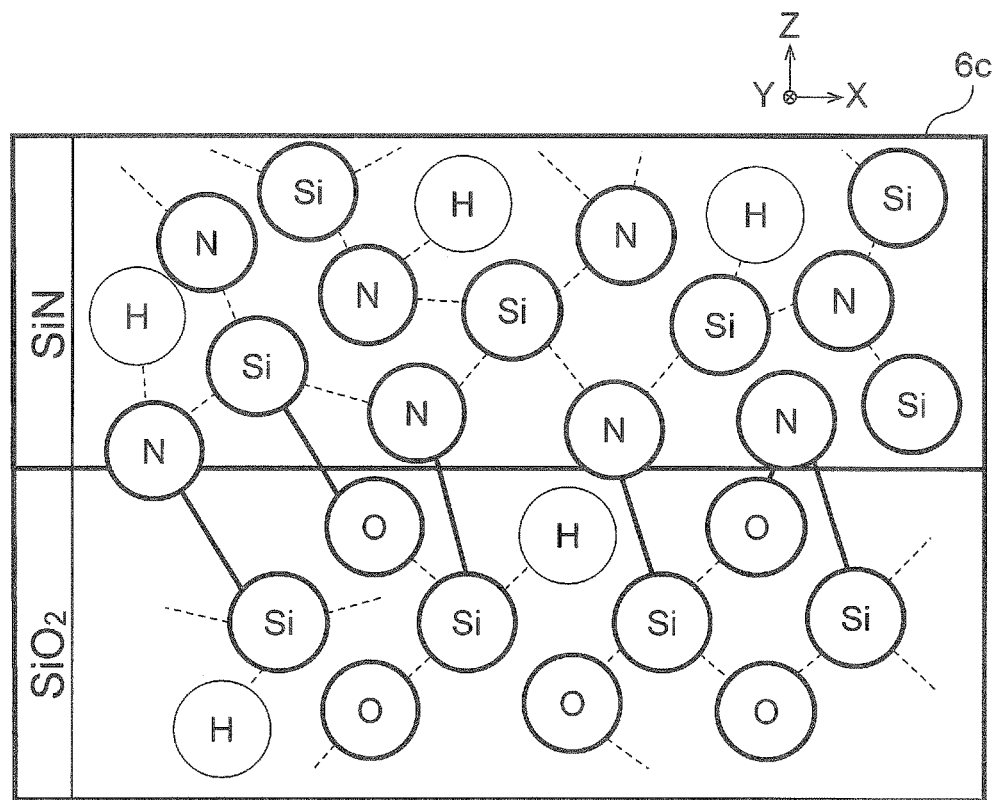
FIGS. 2A and 2B are schematic sectional views for explaining an adhesion characteristic of an SiCN film.
Figure 2B:
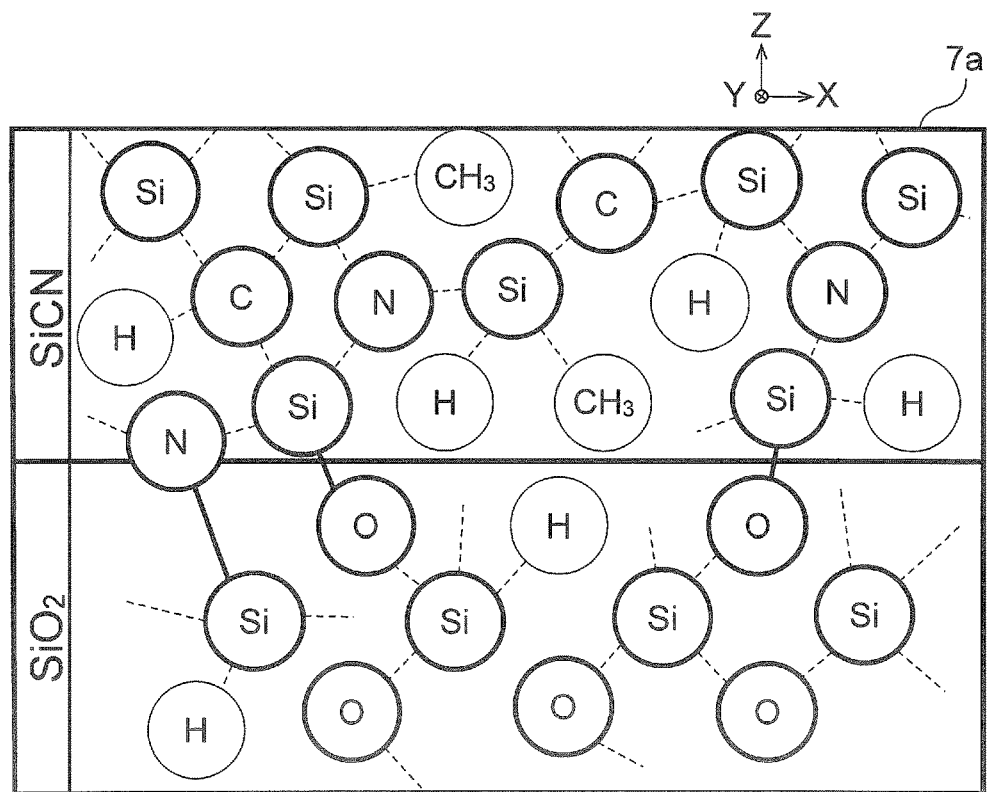

FIGS. 2A and 2B are schematic sectional views for explaining an adhesion characteristic of the SiCN film 7a.

FIG. 2A shows, for comparison, a cross section of a state in which an SiN film 6c is formed on the $SiO_2$ film 5b and the lower interconnects 3 (not shown). FIG. 2A schematically shows Si atoms, O atoms, and N atoms in this cross section. Lines drawn among the atoms represent bonds among the atoms. FIG. 2A further shows H, which is an impurity element and shows, for example, N—H groups included in the SiN film 6c.

FIG. 2B shows a cross section in a state in which the SiCN film 7a is formed on the $SiO_2$ film 5b and the lower interconnects 3 (not shown). FIG. 2B schematically shows Si atoms, O atoms, C atoms, and N atoms in this cross section. FIG. 2B further shows H, which is the impurity element, and shows, for example, Si—$CH_3$ groups included in the SiCN film 7a. As illustrated in FIG. 2B, $CH_3$ of an Si—$CH_3$ group has only one atomic bond. Accordingly, if the content of the Si—$CH_3$ groups in the SiCN film 7a increases, adhesion of the SiCN film 7a and the $SiO_2$ film 5b is considered to be deteriorated. This holds true for the Si—H groups. Therefore, in this embodiment, it is desirable to reduce the contents of the Si—H groups and the Si—$CH_3$ groups in the SiCN film 7a.

FIGS. 3A to 5C are sectional views showing a method of manufacturing the semiconductor device in the first embodiment.

Figure 3A:
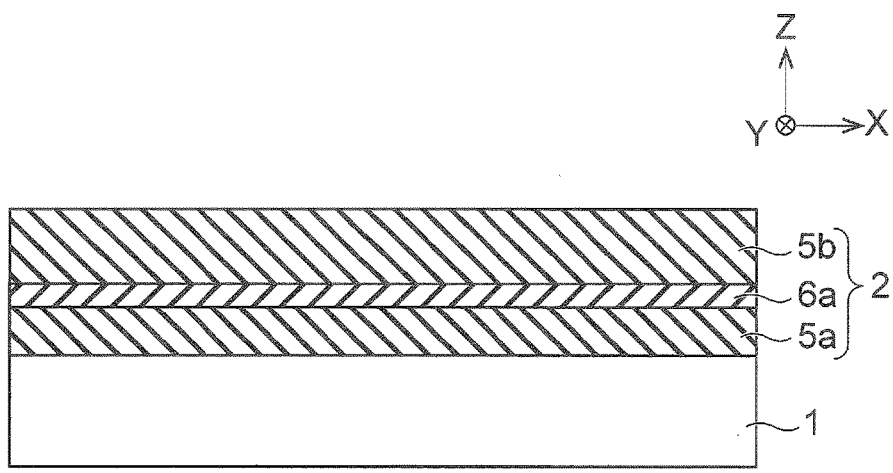
FIGS. 3A to 5C are sectional views showing a method of manufacturing the semiconductor device in the first embodiment.
Figure 3B:
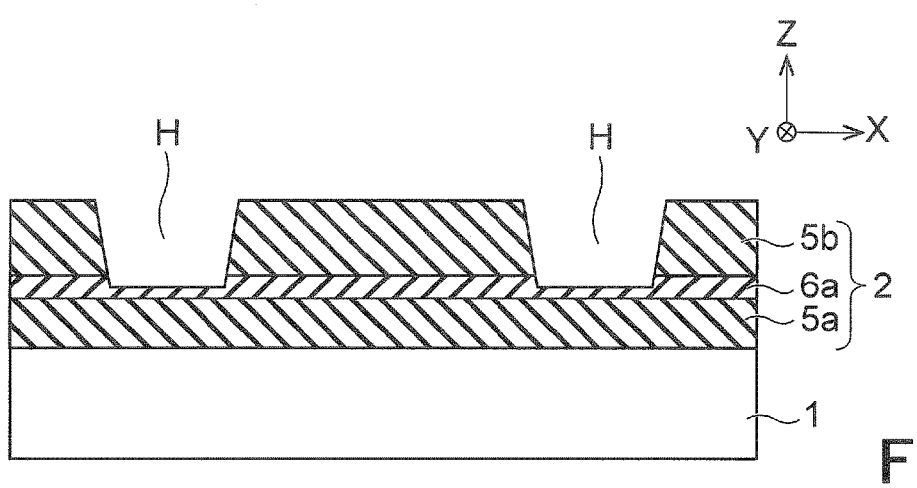

First, the $SiO_2$ film 5a, the SiN film 6a, and the $SiO_2$ film 5b are formed in order on the substrate 1 (FIG. 3A). Next, a plurality of interconnect trenches H are formed in the $SiO_2$ film 5b (FIG. 3B). The interconnect trenches H are formed by etching the $SiO_2$ film 5b using the SiN film 6a as an etching stopper.

Figure 3C:
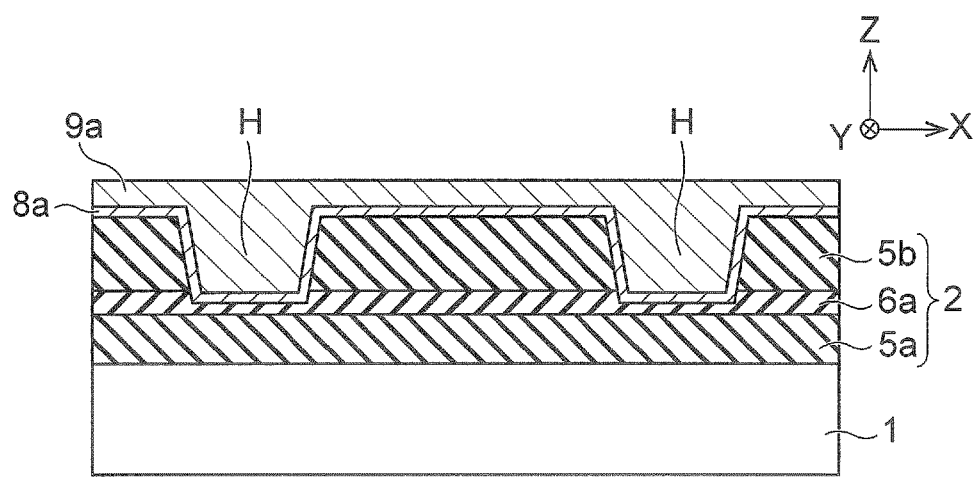
Figure 4A:
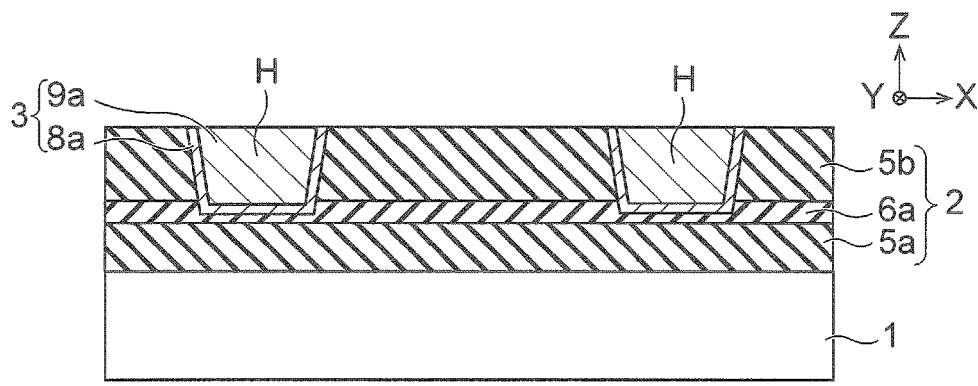

Next, the barrier metal layer 8a and the interconnect material layer 9a are formed in order over the entire surface of the substrate 1 (FIG. 3C). As a result, the barrier metal layer 8a is formed in the interconnect trenches H. The interconnect material layer 9a is formed in the interconnect trenches H via the barrier metal layer 8a. The barrier metal layer 8a is, for example, a TaN film or a TiN film. The interconnect material layer 9a is, for example, a Cu layer Next, the surfaces of the interconnect material layer 9a and the barrier metal layer 8a are planarized by CMP (Chemical Mechanical Polishing) (FIG. 4A). As a result, the interconnect material layer 9a and the barrier metal layer 8a outside the interconnect trenches H are removed. The lower interconnects 3 are formed in the interconnect trenches H.

Figure 4B:
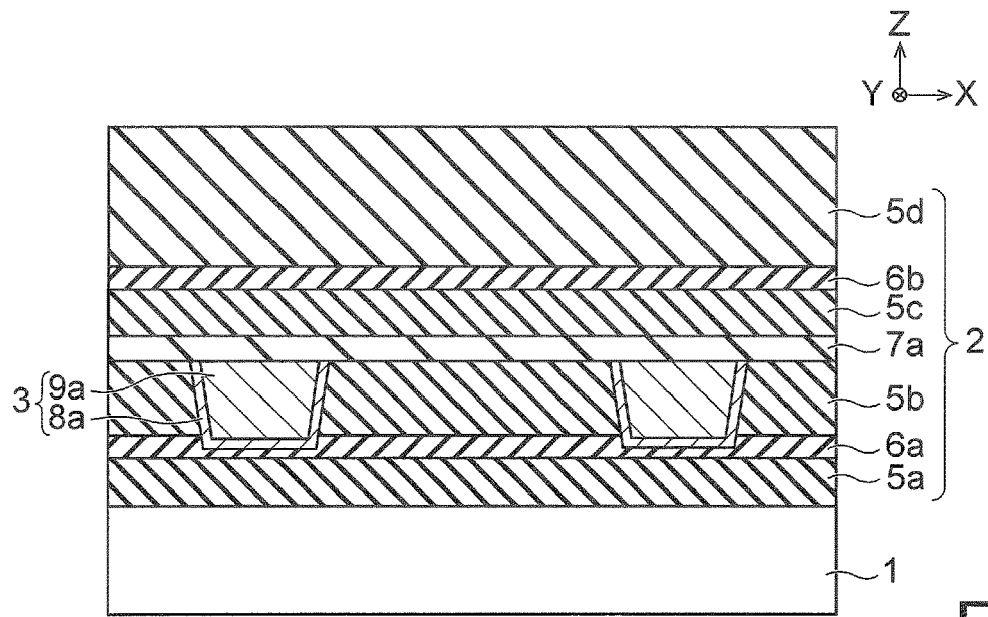

Next, the SiCN film 7a, the $SiO_2$ film 5c, the SiN film 6b, and the $SiO_2$ film 5d are formed in order on the lower interconnects 3 and the $SiO_2$ film 5b (FIG. 4B). The SiCN film 7a is formed by, for example, plasm CVD using an $SiH(CH_3)_3$ gas and an $NH_3$ gas in a chamber in which the substrate 1 is housed. At this time, the $SiH(CH_3)_3$ gas is supplied into the chamber at a flow rate of, for example, 150 to 350 sccm and the $NH_3$ gas is supplied into the chamber at a flow rate of, for example, 1000 to 1400 sccm. An inert gas may be supplied into the chamber together with the $SiH(CH_3)_3$ gas and the $NH_3$ gas. For example, an $N_2$ (nitrogen) gas may be supplied into the chamber at a flow rate of 500 to 1500 sccm or an He (helium) gas may be supplied into the chamber at a flow rate of 500 to 1500 sccm. By forming the SiCN film 7a under such a condition, the content of the Si—H groups in the SiCN film 7a can be adjusted to 6.0% or less. Further, the content of the Si—$CH_3$ groups in the SiCN film 7a can be adjusted to 0.5% or less. The pressure in the chamber is set to, for example, 3.0 to 4.0 Torr. RF (Radio Frequency) applied power for the plasma CVD is set to, for example, 600 to 700 W. The thickness of the SiCN film 7a is, for example, 60 nm.

In order to remove a $CuO_x$ film (a native oxide film) formed on the surface of the Cu layer (the interconnect material layer 9a), pretreatment by $NH_3$ plasma may be performed between the step in FIG. 4A and the step in FIG. 4B. The pretreatment is performed, for example, as explained below. First, the substrate 1 is carried into the chamber and gas stabilize treatment is performed. Next, the pretreatment by the $NH_3$ plasma is performed to remove the $CuO_x$ film. Next, the plasma is turned off and the gas stabilize treatment is performed. The pretreatment is performed in this way. Thereafter, a formation process for the SiCN film 7a is performed in the chamber, the plasma of the plasma CVD is turned off, and the substrate 1 is carried out from the chamber.

Figure 4C:
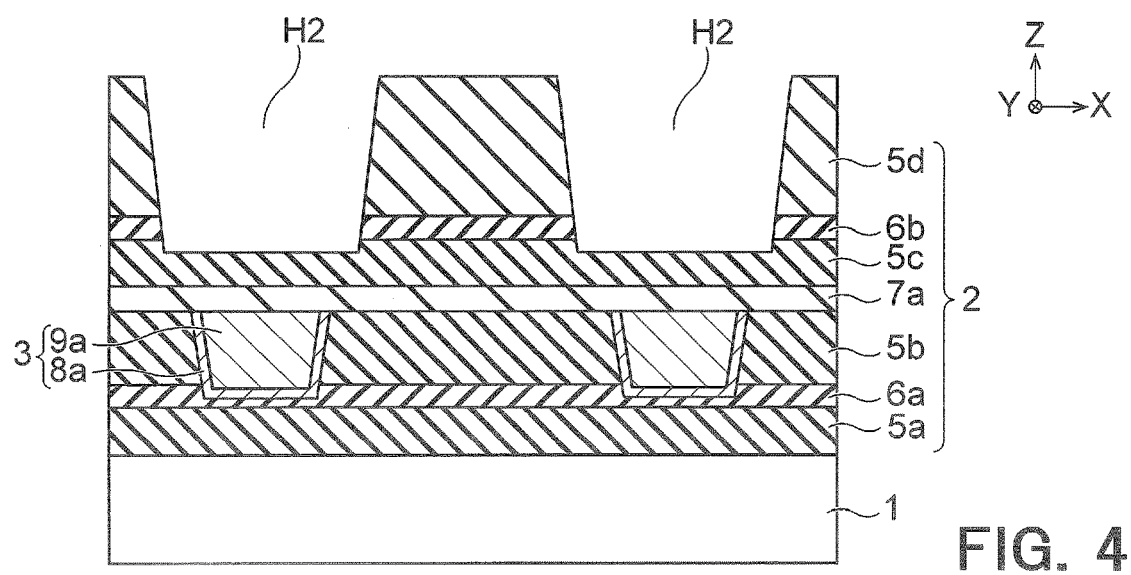
Figure 5A:
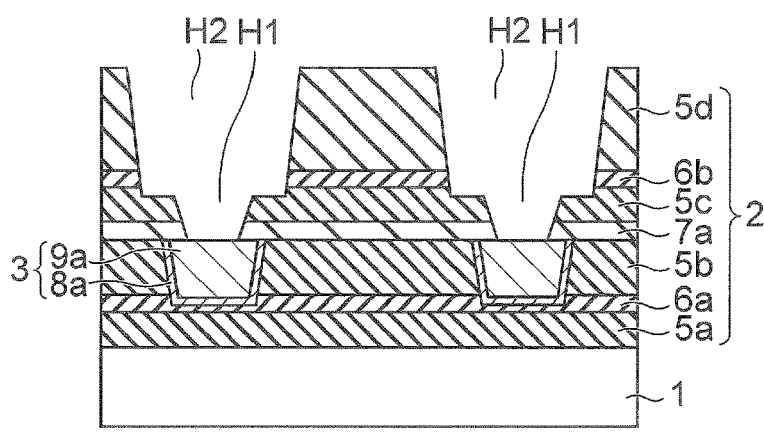

Next, a plurality of interconnect trenches H2 are formed in the $SiO_2$ film 5d (FIG. 4C). The interconnect trenches H2 are formed by etching the $SiO_2$ film 5d using the SiN film 6b as an etching stopper. Next, a plurality of via holes H1 are formed in the $SiO_2$ film 5c and the SiCN film 7a (FIG. 5A). The via holes H1 are formed by etching the $SiO_2$ film 5c and the SiCN film 7a and are formed in the bottoms of the interconnect trenches H2 to reach the upper faces of the lower interconnects 3. In the following explanation, the via holes H1 and the interconnect trenches H2 are described as "openings H1 and H2" as well.

Figure 5B:
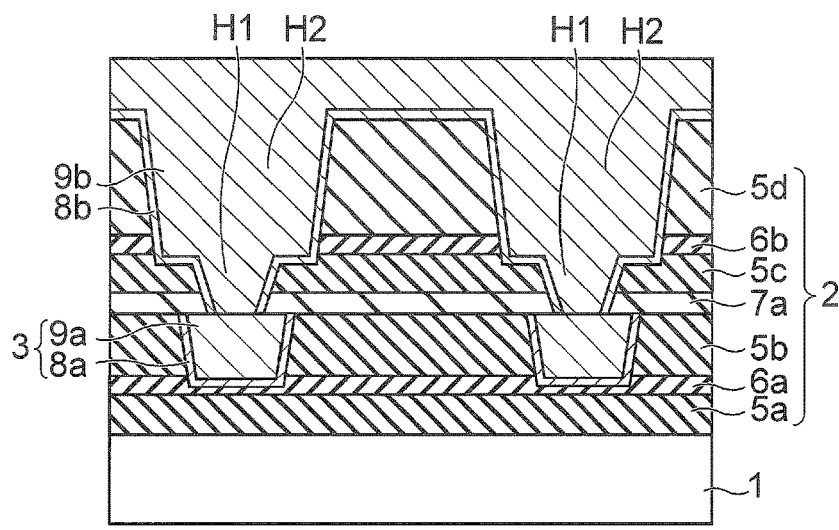

Next, the barrier metal layer 8b is formed over the entire surface of the substrate 1. The barrier metal layer 8b is removed from the upper faces of the lower interconnects 3 in the openings (the via holes) H1. The interconnect material layer 9b is formed over the entire surface of the substrate 1 (FIG. 5B). As a result, the barrier metal layer 8b is formed in the openings H1 and H2. The interconnect material layer 9b is formed in the openings H1 and H2 via the barrier metal layer 8b. The barrier metal layer 8b is, for example, a TaN film or a TiN film. The interconnect material layer 9b is, for example, a Cu layer. A step of removing the barrier metal layer 8b from the upper faces of the lower interconnects 3 in the openings (the via holes) H1 may be omitted.

Figure 5C:
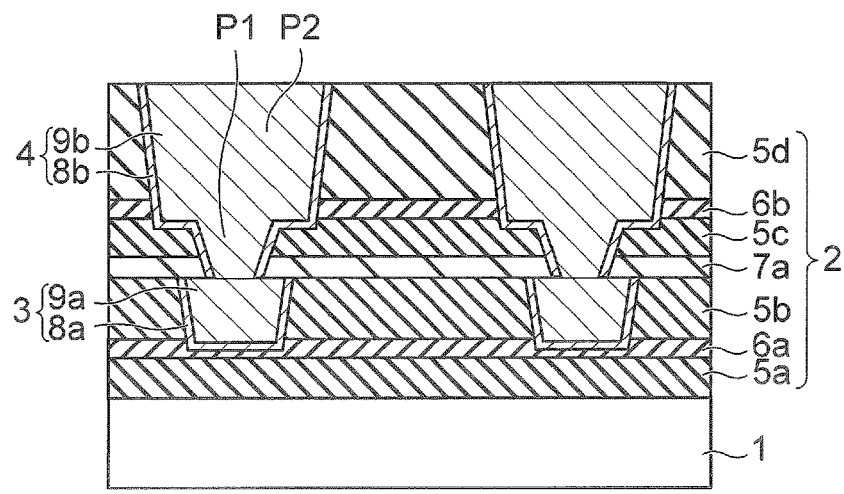

Next, the surfaces of the interconnect material layer 9b and the barrier metal layer 8b are planarized by the CMP (FIG. 5C). As a result, the interconnect material layer 9b and the barrier metal layer 8b outside the openings H1 and H2 are removed. The upper interconnects 4 are formed in the openings H1 and H2. Specifically, the plug portions P1 are formed in the via holes H1. The interconnect portions P2 are formed in the interconnect trenches H2.

Thereafter, various inter layer dielectrics and interconnect layers are formed on the substrate 1. The semiconductor device shown in FIG. 1 is manufactured in this way.

According to this embodiment, by forming the SiCN film 7a on the lower interconnects 3, it is possible to reduce the capacitance between the lower interconnects 3 and the upper interconnects 4 while preventing Cu atoms in the interconnect material layers 9a from diffusing in the upward direction of the interconnect material layers 9. For example, the specific dielectric constant of the SiCN film 7a in this embodiment is a low value equal to or smaller than 5.3 (for example, approximately 5.0). The refractive index of the SiCN film 7a in this embodiment is, for example, 1.80 or more and 1.90 or less.

According to this embodiment, by forming the SiCN film 7a under the conditions explained above, the contents of the Si—H groups and the Si—$CH_3$ groups in the SIGN film 7a can be respectively adjusted to 6.0% or less and 0.5% or less. Consequently, it is possible to suppress the SiCN film 7a from peeling from the $SiO_2$ films 5b and 5c and suppress cracks from occurring in the interfaces between the SIGN film 7a and the $SiO_2$ films 5b and 5c. Further, as explained below, from the viewpoint of suppressing a leak current, it is more preferable to set the content of the Si—H groups in the SIGN film 7a to 5.5% or less.

Figure 13:
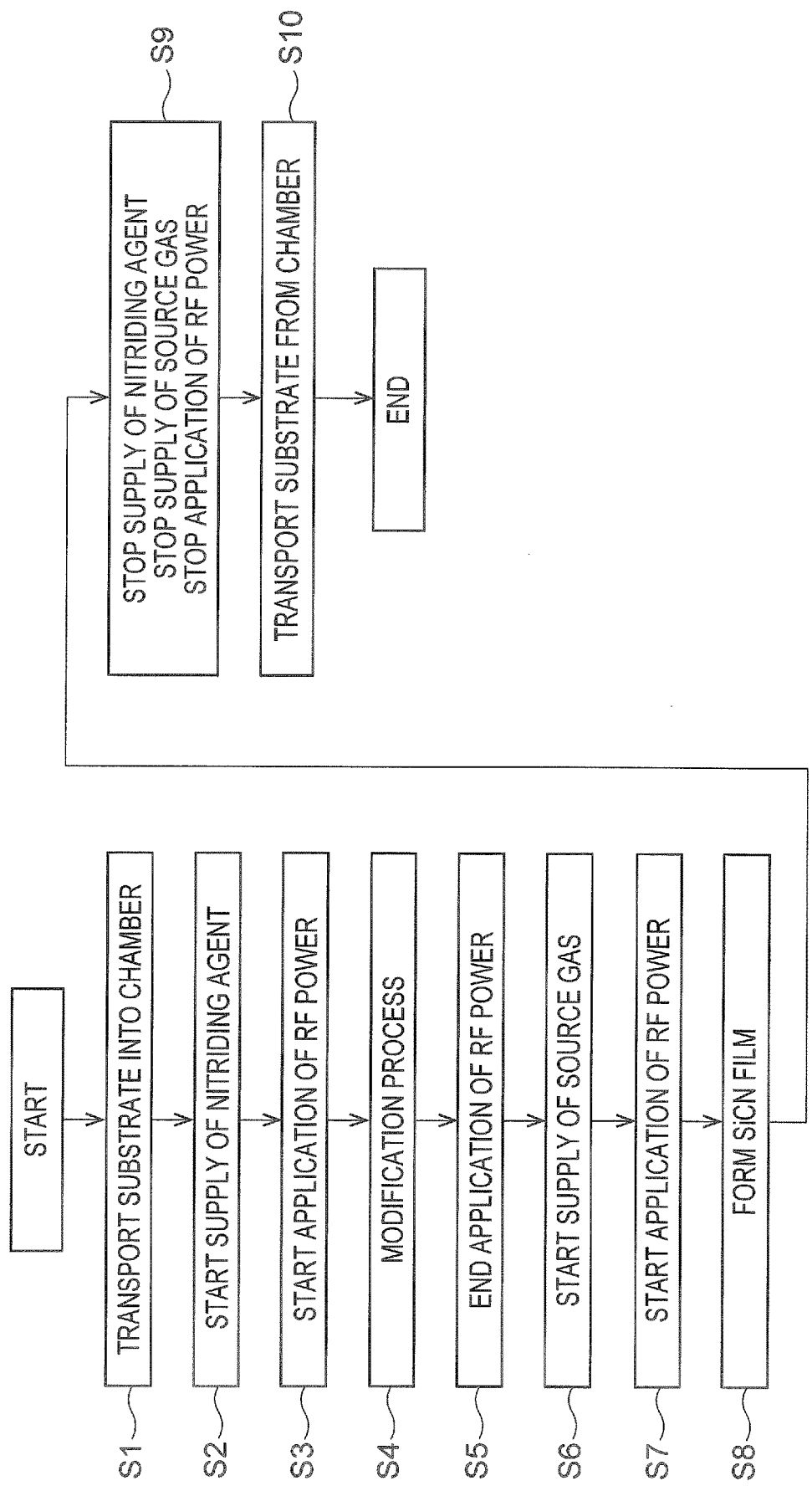
FIG. 13 is a flowchart showing the method of manufacturing the semiconductor device in the first embodiment.

FIG. 13 is a flowchart showing the method of manufacturing the semiconductor device in the first embodiment. FIG. 13 shows a flow of forming the SIGN film 7a in the step of FIG. 4B.

First, the substrate 1 is transported into the chamber (step S1), and supply of a nitriding agent into the chamber is started (step S2). The nitriding agent is, for example, the $NH_3$ gas. In step S2, supply of the $N_2$ gas and/or He gas into the chamber may be also started.

Next, application of RF power in the chamber is started (step S3), a modification process of the $SiO_2$ film 5b is performed (step S4), and the application of the RF power is ended (step S5). The modification process is performed, for example, to terminate dangling bonds in the $SiO_2$ film 5b with OH. Steps S3 to S5 may be omitted.

Next, supply of a source gas into the chamber is started (step S6), and application of RF power in the chamber is started (step S7). As a result, the SiCN film 7a is formed on the lower interconnects 3 and the $SiO_2$ film 5b that have been formed above the substrate 1 (step S8). The source gas is, for example, the $SiH(CH_3)_3$ gas. The pressure in the chamber is set to, for example, 5.0 Torr or less. The RF power is set to, for example, 1000 W or less. The ratio of the flow rate of the source gas to the flow rate of the nitriding agent is set to, for example, 25% or less. More preferably, the ratio of the flow rate of the source gas to the flow rate of the nitriding agent is set to, for example, 20% or less. According to experiments, it has been understood that the electric characteristics can be improved by making the ratio of the flow rate of the source gas to the flow rate of the nitriding agent be 20% or less.

Next, the supply of the nitriding agent, the supply of the source gas, and the application of RF power is ended (step S9), and the substrate 1 is transported from the chamber (step S10). In the case where the supply of the $N_2$ gas and/or He gas into the chamber is started in step S2, the supply of the $N_2$ gas and/or He gas is ended in step S9.

Figure 6A:
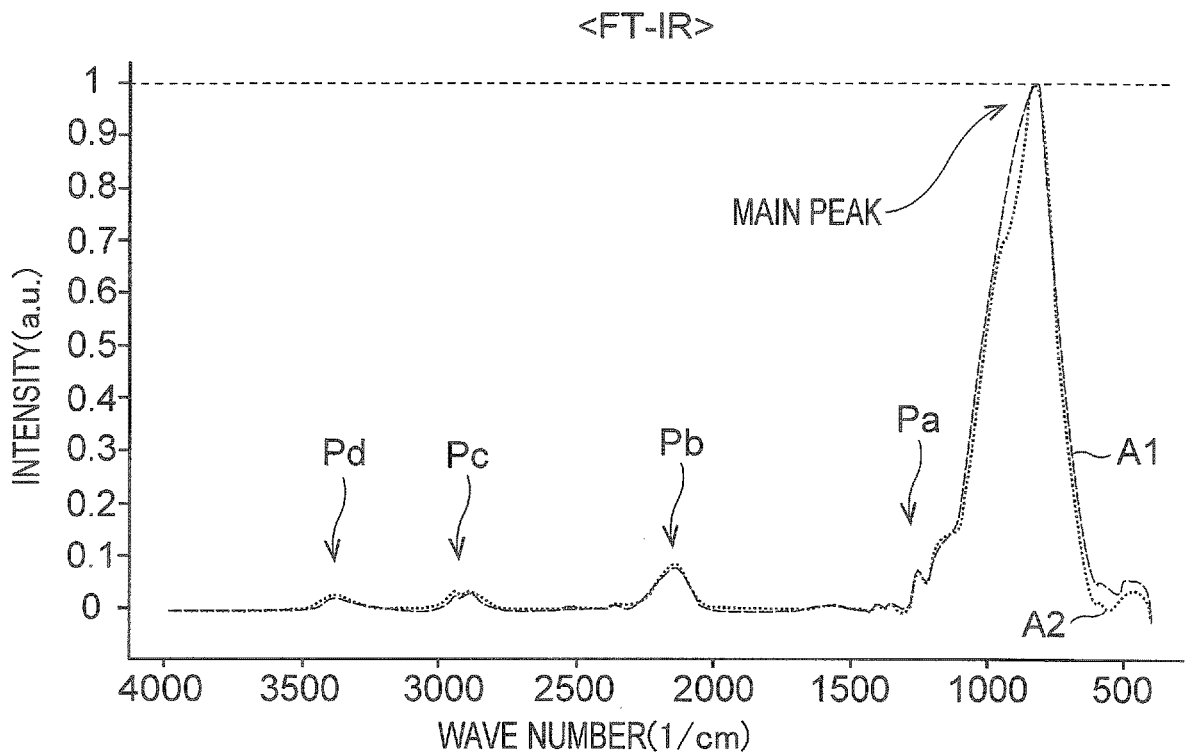
FIGS. 6A and 6B are graphs for explaining characteristics of the SiCN film.
Figure 6B:
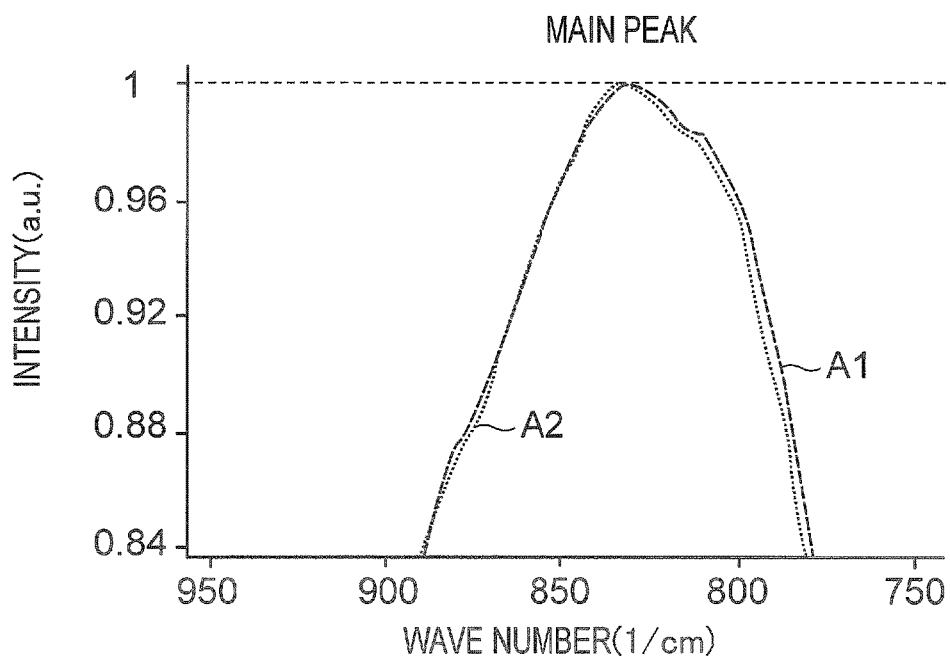

FIGS. 6A and 6B are graphs for explaining characteristics of the SiCN film 7a.

FIG. 6A shows spectra obtained by applying FT-IR (Fourier-transform infrared spectroscopy) to the SiCN film 7a. A curve A1 indicates a spectrum of the SiCN film 7a formed using an He gas together with a material gas. A curve A2 indicates a spectrum of the SiCN film 7a formed using an $N_2$ gas together with the material gas. In FIG. 6A, the horizontal axis represents a wave number and the vertical axis represents intensity. According to FIG. 6A, the curves A1 and A2 indicate highest intensity peaks (main peaks) at a wave number of 500 to 1000 [1/cm].

FIG. 6B is an enlarged graph of the main peaks shown in FIG. 6A. Both the curves A1 and A2 indicate peaks at a wave number of approximately 850 [1/cm]. The peaks are due to the Si—C groups (Si—C bonds) and the Si—N groups (Si—N bonds) in the SiCN film 7a. Since the SiCN film 7a includes a large number of Si—C groups and a large number of Si—N groups, the peaks (the main peaks) due to the Si—C groups and the Si—N groups are high in both the curves A1 and A2. Both the intensities of the curves A1 and A2 are standardized such that the intensities of the main peaks are "1".

FIGS. 7A to 7D are other graphs for explaining the characteristics of the SiCN film 7a.

FIG. 7A, FIG. 7B, FIG. 7C, and FIG. 7D are respectively enlarged graphs of peaks Pa, Pb, Pc, and Pd of the curve A1 and A2 in FIG. 6A. The peak Pa in FIG. 7A is due to the Si—$CH_3$ groups in the SiCN film 7a. The peak Pb in FIG. 7B is due to the Si—H groups in the SiCN film 7a. The peak Pc in FIG. 7C is due to the C—H groups in the SiCN film 7a. The peak Pd in FIG. 7D is due to the N—H groups in the SiCN film 7a. The peak Pa is seen near 1250 [1/cm]. The peak Pb is seen near 2150 [1/cm].

Figure 14A:
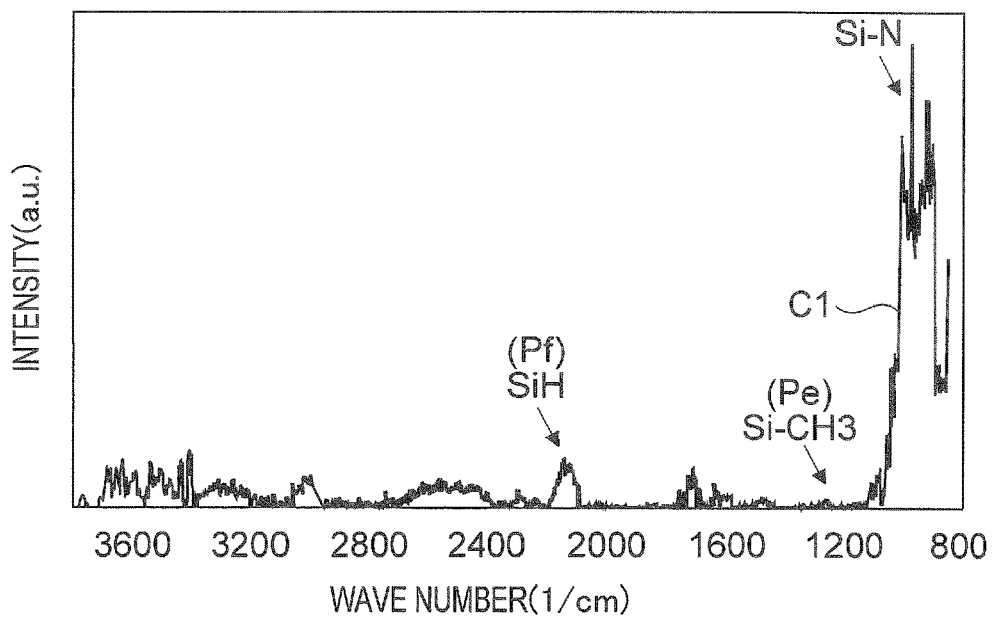
FIGS. 14A to 14C are other graphs for explaining characteristics of the SiCN film.
Figure 14B:
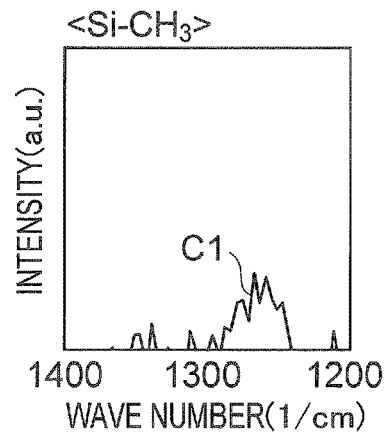
Figure 14C:
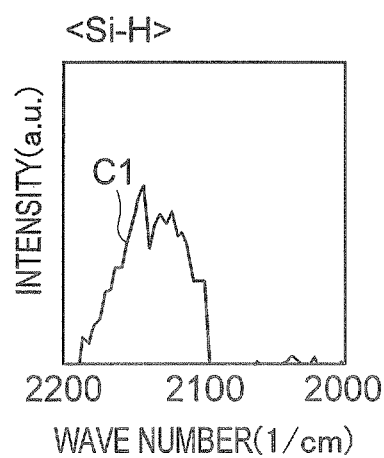

FIGS. 14A to 14C are other graphs for explaining characteristics of the SiCN film.

The curve C1 in FIG. 14A shows spectra obtained by applying AFM-IR (Atomic Force Microscope based Infrared Spectroscopy) to the SiCN film 7a. In FIG. 14A, the horizontal axis represents a wave number and the vertical axis represents intensity. According to FIG. 14A, the curve C1 represents the spectrum regarding the SiCN film 7a formed by using the $N_2$ gas together with the material gas, and indicates a highest intensity peak (main peak) at a wave number of the lower detection limit (e.g., 800) to 1000 [1/cm] similarly to the curves A1, A2. This peak is due to the Si—C groups and the Si—N groups in the SiCN film 7a similarly to the peaks in FIG. 6B.

FIGS. 14B and 14C are respectively enlarged graphs of peaks Pe and Pf of the curve C1 in FIG. 14A. The peak Pe in FIG. 14B is due to the Si—$CH_3$ groups in the SiCN film 7a. The peak Pf in FIG. 14C is due to the Si—H groups in the SiCN film 7a. Similarly to the peaks Pa and Pb, the peak Pe is seen near 1250 [1/cm] and the peak Pf is seen near 2150 [1/cm].

These measurement results reveal the following.

First, in the SiCN film 7a (the curve A1) formed using the He gas together with the material gas, the content of the Si—$CH_3$ groups is 0.37%, the content of the Si—H groups is 5.40%, the content of the C—H groups is 2.04%, and the content of the N—H groups is 1.04%.

Second, in the SiCN film 7a (the curve A2) formed using the $N_2$ gas together with the material gas, the content of the Si—$CH_3$ groups is 0.40%, the content of the Si—H groups is 5.42%, the content of the C—H groups is 2.09%, and the content of the N—H groups is 1.07%.

Third, in the SiCN film 7a (the curve C1) formed using the $N_2$ gas together with the material gas, the content of the Si—$CH_3$ groups is 0.39%, and the content of the Si—H groups is 5.04%.

It should be noted that both the contents of the Si—$CH_3$ groups in the curves A1, A2 and C1 are less than 0.5%. The condition "the content of the Si—$CH_3$ groups in the SiCN film 7a is set to 0.5% or less" explained above can be realized by, for example, when forming the SiCN film 7a, adjusting a flow rate ratio of the $SiH(CH_3)_3$ gas and the $NH_3$ gas, which are the material gas, the pressure in the chamber, plasma power for the plasma CVD, and an inter-electrode distance as described above.

According to an experiment, a $K_{IC}$ value of an SiCN film, the content of the Si—$CH_3$ groups of which is 0.93%, was 0.212 [M·Pa·m$^{1/2}$]. The $K_{IC}$ value is a critical stress intensity factor obtained using an m-ELT (modified Edge Liftoff Test) method, which is a representative evaluation method for evaluating adhesion strength of a thin film, and is an indicator indicating the strength of adhesive power. On the other hand, in the SiCN film 7a, the content of the Si—$CH_3$ film of which is 0.37% as in this embodiment, the $K_{IC}$ value of the SiCN film 7a was 0.354 [M·Pa·m$^{1/2}$]. This indicates that, since the content of the Si—$CH_3$ groups decreased, the $K_{IC}$ value increased, that is, the adhesive power of an interface increased. Similarly, the adhesive power of the interface also increases when the content of the Si—H groups in the SiCN film 7a is reduced. In the SiCN film 7a in this embodiment, desired adhesive power can be obtained by setting the content of the Si—H groups to 6.0% or less and setting the content of the Si—$CH_3$ groups to 0.5% or less.

The content (%) of the Si—$CH_3$ groups in the curve A1 is content obtained by dividing an integrated value of the peak Pa of the curve A1 by an integrated value of the main peak of the curve A1 and representing an obtained value in percentage. This is the same about the content (%) of the Si—$CH_3$ groups in the curves A2 and C1 and the content (%) of other groups in the curves A1, A2 and C1. As it is seen from this calculation method, the content (%) of the Si—$CH_3$ groups in the SiCN film 7a in this embodiment is standardized such that the content (%) of the Si—C groups in the Si—CN film 7a is 100% (the same applies to the other groups).

Figure 8:
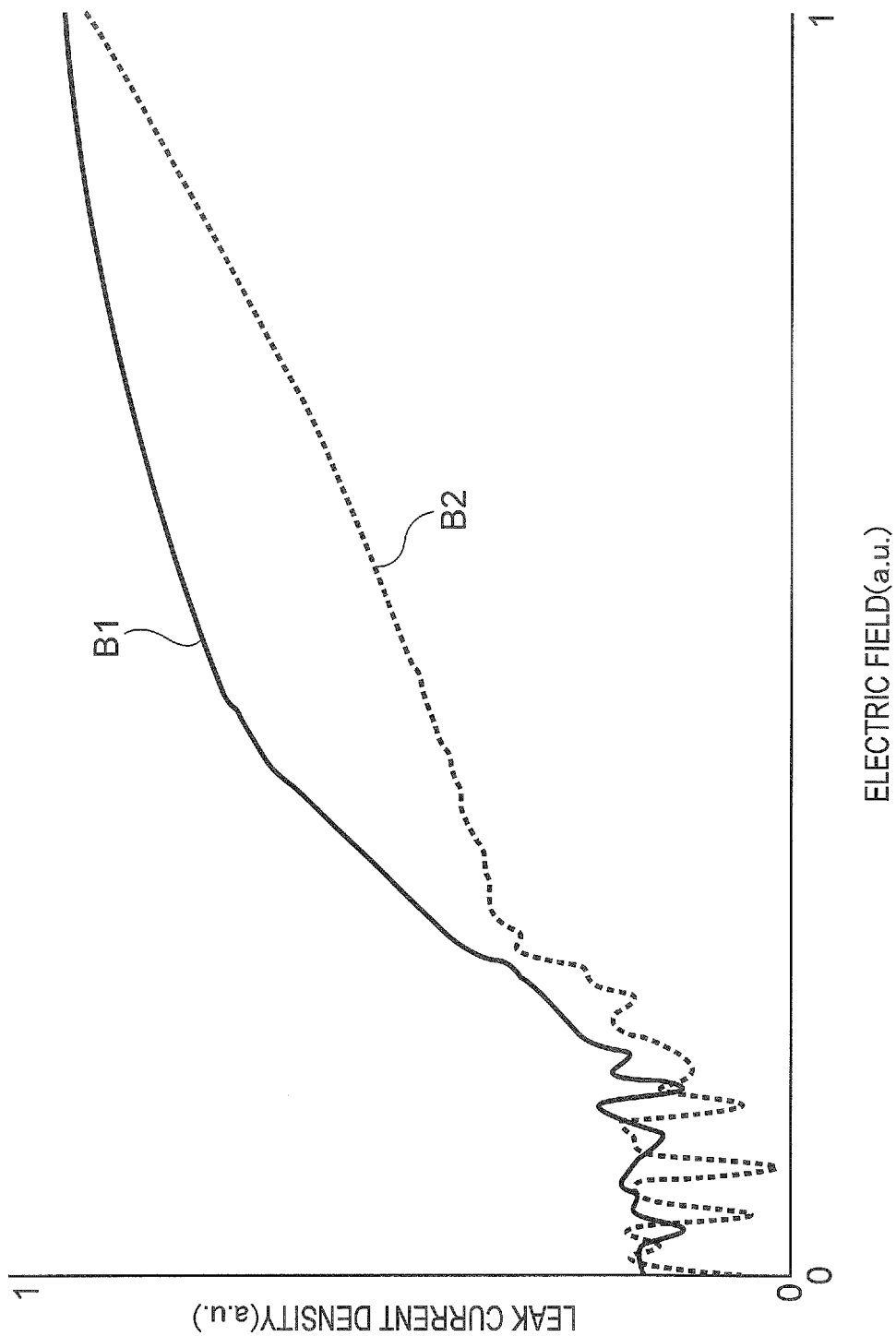
FIG. 8 is a graph for explaining an electric characteristic of the SiCN film.

FIG. 8 is a graph for explaining an electric characteristic of the SiCN film 7a.

The graph of FIG. 8 shows a relation between an electric field and a leak current in the semiconductor device in this embodiment. The horizontal axis of FIG. 8 indicates the intensity of the electric field and the vertical axis of FIG. 8 indicates the density of the leak current. A curve B1 indicates a current-electric field curve obtained when the SiCN film 7a, the contents of the Si—H groups and the Si—$CH_3$ groups of which were respectively adjusted to 6.0% and 0.5%, was used. A curve B2 indicates a current-electric field curve obtained when the SiCN film 7a, the contents of the Si—H groups and the Si—CH$_3$ groups of which were respectively adjusted to 5.5% and 0.5%, was used. The curves B1 and B2 was obtained by a mercury probe. According to FIG. 8, it is seen that the leak current further decreases when the content of the Si—H groups in the SiCN film 7a is changed from 6.0% to 5.5%. According to this embodiment, by setting the content of the Si—H groups in the SiCN film 7a to 5.5% or less and setting the content of the Si—CH$_3$ groups in the SiCN film 7a to 0.5% or less, the SiCN film 7a having adhesion while having a desired electric characteristic can be obtained.

Figure 15:
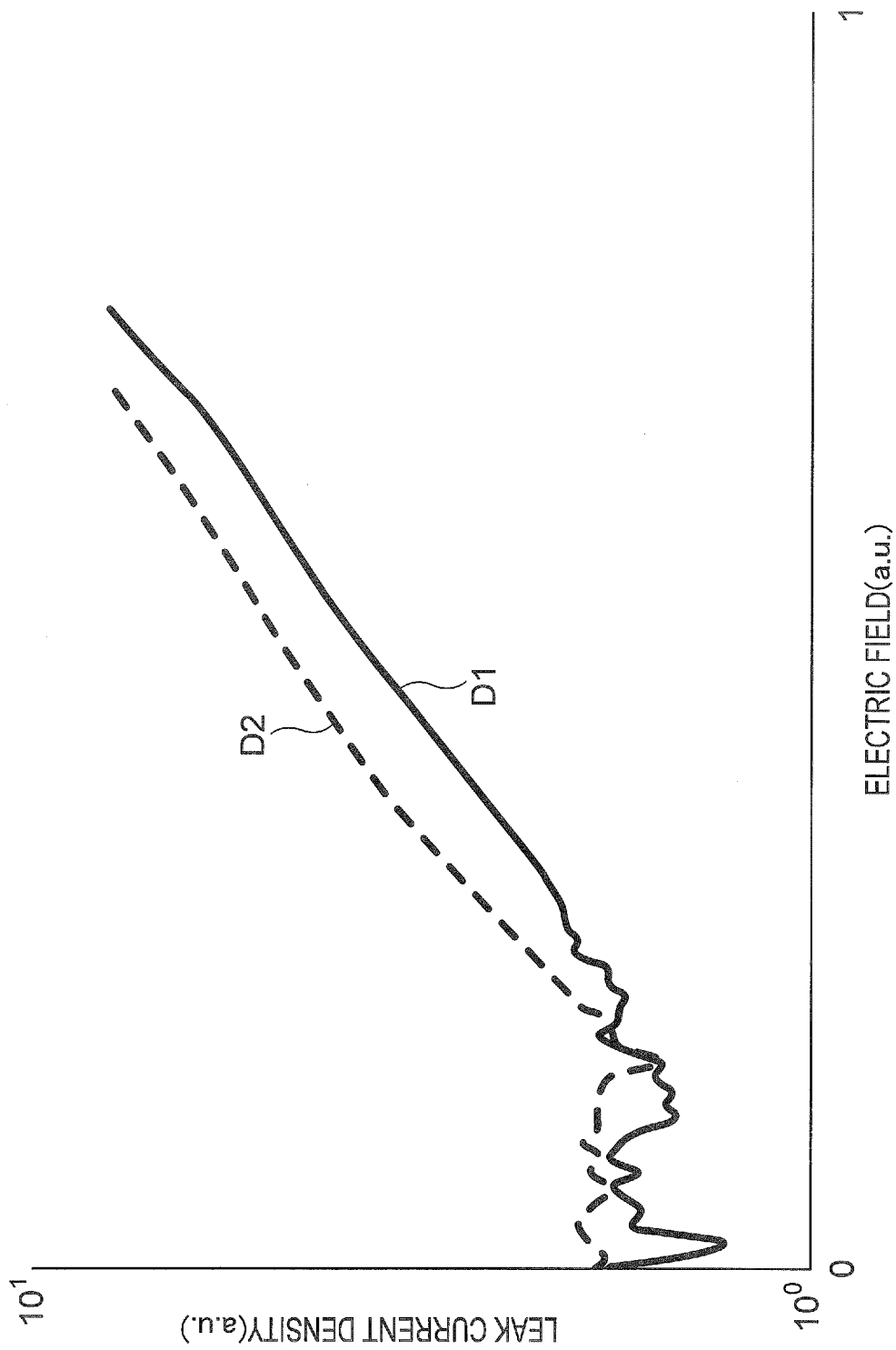
FIG. 15 is another graph for explaining an electric characteristic of the SiCN film.

FIG. 15 is another graph for explaining an electric characteristic of the SiCN film.

The graph of FIG. 15 also shows a relation between an electric field and a leak current in the semiconductor device in this embodiment. The horizontal axis of FIG. 15 indicates the intensity of the electric field and the vertical axis of FIG. 15 indicates the density of the leak current. A curve D1 indicates a current-electric field curve in a case where the SiCN film 7a is formed by using the N$_2$ gas in the step of FIG. 4B. A curve D2 indicates a current-electric field curve in a case where the SiCN film 7a is formed by using the He gas in the step of FIG. 4B. According to FIG. 15, it is understood that the leak current when using the N$_2$ gas is almost smaller than the leak current when using the He gas, and therefore the usage of the N$_2$ gas is more preferred than the usage of the He gas.

As explained above, the semiconductor device in this embodiment includes the SiCN film 7a on the lower interconnects 3. The content of the Si—H groups in the SiCN film 7a is 6.0% or less. The content of the Si—CH$_3$ groups in the SiCN film 7a is 0.5% or less. Accordingly, according to this embodiment, it is possible to improve characteristics of the insulator (the SiCN film 7a) provided on the upper faces of the lower interconnects 3. For example, according to this embodiment, it is possible to prevent the Cu atoms in the interconnect material layer 9a from diffusing in the upward direction of the interconnect material layer 9a, reduce the capacitance between the lower interconnects 3 and the upper interconnects 4, and suppress peeling of the SiCN film 7a and occurrence of cracks. Further, by setting the content of the Si—H groups in the SiCN film 7a to 5.5% or less, it is possible to improve the electric characteristic of the SiCN film 7a.

Second Embodiment

Figure 9:
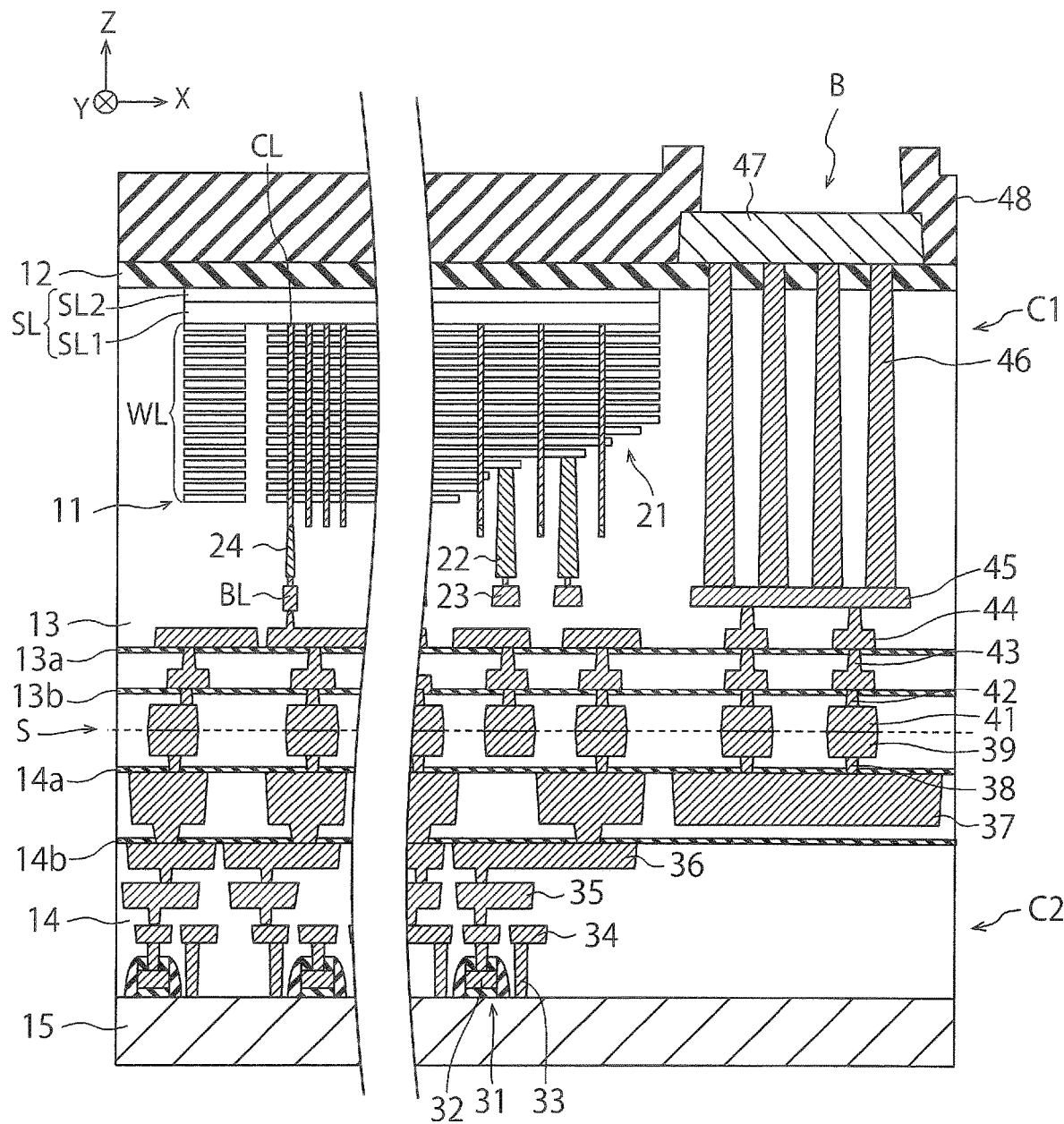
FIG. 9 is a sectional view showing the structure of a semiconductor device in a second embodiment.

FIG. 9 is a sectional view showing the structure of a semiconductor device in a second embodiment. The semiconductor device shown in FIG. 9 is a three-dimensional memory obtained by pasting together an array region C1 and a circuit region C2. One of the array region C1 and the circuit region C2 is an example of a first region. The other of the array region C1 and the circuit region C2 is an example of a second region.

The array region C1 includes a memory cell array 11 including a three-dimensionally arranged plurality of memory cells, an insulator 12 on the memory cell array 11, and an inter layer dielectric 13 under the memory cell array 11. The insulator 12 is, for example, an SiO$_2$ film or an SiN film. The inter layer dielectric 13 is, for example, a laminated film including an SiO$_2$ film and other insulators (an SiN film, an SiCN film, and the like). FIG. 9 shows SiCN films 13a and 13b included in the inter layer dielectric 13.

The circuit region C2 is provided under the array region C1. A sign S indicates a pasting face of the array region C1 and the circuit region C2. The circuit region C2 includes an inter layer dielectric 14 and a substrate 15 under the inter layer dielectric 14. The inter layer dielectric 14 is, for example, a laminated film including an SiO$_2$ film and other insulators (an SiN film, an SiCN film, and the like). FIG. 9 shows SiCN films 14a and 14b included in the inter layer dielectric 14. The substrate 15 is, for example, a semiconductor substrate such as an Si substrate.

FIG. 9 shows an X direction and a Y direction parallel to the surface of the substrate 15 and perpendicular to each other and a Z direction perpendicular to the surface of the substrate 15. In this embodiment, a +Z direction is treated as an upward direction and a −Z direction is treated as a downward direction. The −Z direction may coincide with the gravity direction or may not coincide with the gravity direction. The Z direction is an example of a first direction.

The array region C1 includes a plurality of word lines WL and a source line SL as a plurality of electrode layers in the memory cell array 11. FIG. 9 shows a step structure portion 21 of the memory cell array 11. The word lines WL are electrically connected to word interconnect layers 23 via contact plugs 22. Columnar portions CL piercing through the plurality of word lines (electrode layers) WL are electrically connected to bit lines BL via via plugs 24 and are electrically connected to the source line SL. The source line SL includes a first layer SL1, which is a semiconductor layer, and a second layer SL2, which is a metal layer.

The circuit region C2 includes a plurality of transistors 31. The transistors 31 include gate electrodes 32 provided on the substrate 15 via gate insulators and not-shown source diffusion layers and not-shown drain diffusion layers provided in the substrate 15. The circuit region C2 further includes a plurality of contact plugs 33 provided on the source diffusion layers or the drain diffusion layers of the transistors 31, an interconnect layer 34 provided on the contact plugs 33 and including a plurality of interconnects, and an interconnect layer 35 provided on the interconnect layer 34 and including a plurality of interconnects. The circuit region C2 further includes an interconnect layer 36 provided on the interconnect layer 35 and including a plurality of interconnects, an interconnect layer 37 provided on the interconnect layer 36 and including a plurality of interconnects, a plurality of via plugs 38 provided on the interconnect layer 37, and a plurality of metal pads 39 provided on the via plugs 38. Each of the interconnect layers 34 to 37, the via plugs 38, and the metal pads 39 is, for example, a metal layer including a Cu layer. The circuit region C2 functions as a control circuit (a logical circuit) that controls the operation of the array region C1. The control circuit is configured by the transistors 31 and the like and is electrically connected to the metal pads 39.

The array region C1 includes a plurality of metal pads 41 provided on the metal pads 39, a plurality of via plugs 42 provided on the metal pads 41, an interconnect layer 43 provided on the via plugs 42 and including a plurality of interconnects, and an interconnect layer 44 provided on the interconnect layer 43 and including a plurality of interconnects. The array region C1 further includes an interconnect layer 45 provided on the interconnect layer 44 and including a plurality of interconnects, a plurality of via plugs 46 provided on the interconnect layer 45, a metal pad 47 provided on the via plugs 46 and on the insulator 12, and a passivation film 48 provided on the metal pad 47 and on the insulator 12. Each of the metal pads 41, the via plugs 42, and the interconnect layers 43 to 45 is, for example, a metal layer including a Cu layer. The metal pad 47 functions as an external connection pad (a bonding pad) of the semiconductor device shown in FIG. 9. The passivation film 48 is, for example, an insulator such as an $SiO_2$ film or an SiN film and includes an opening B for exposing the upper face of the metal pad 47. The metal pad 47 can be connected to a mounted substrate and other devices by a bonding wire, a solder ball, a metal bump, or the like via the opening B.

Figure 10:
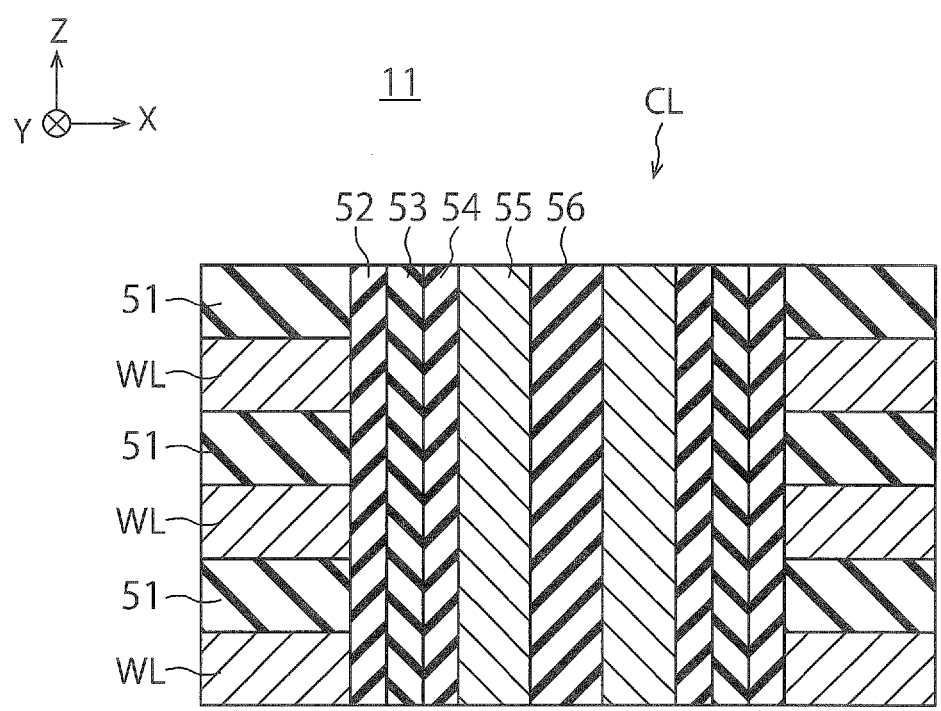
FIG. 10 is a sectional view showing the structure of a columnar portion in the second embodiment.

FIG. 10 is a sectional view showing the structure of a columnar portion CL in the second embodiment.

As shown in FIG. 10, the memory cell array 11 includes a plurality of word lines WL and a plurality of insulating layers 51 alternately stacked on the inter layer dielectric 13 (FIG. 9). The word lines WL are, for example, W (tungsten) layers. The insulating layers 51 are, for example, $SiO_2$ films.

The columnar portion CL includes a block insulator 52, a charge storage layer 53, a tunnel insulator 54, a channel semiconductor layer 55, and a core insulator 56. The charge storage layer 53 is, for example, an SiN film and is formed on side faces of the word lines WL and the insulating layers 51 via the block insulator 52. The charge storage layer 53 may be a semiconductor layer such as a polysilicon layer. The channel semiconductor layer 55 is, for example, a polysilicon layer and is formed on a side face of the charge storage layer 53 via the tunnel insulator 54. The block insulator 52, the tunnel insulator 54, and the core insulator 56 are, for example, $SiO_2$ films or metal insulators.

Figure 11:
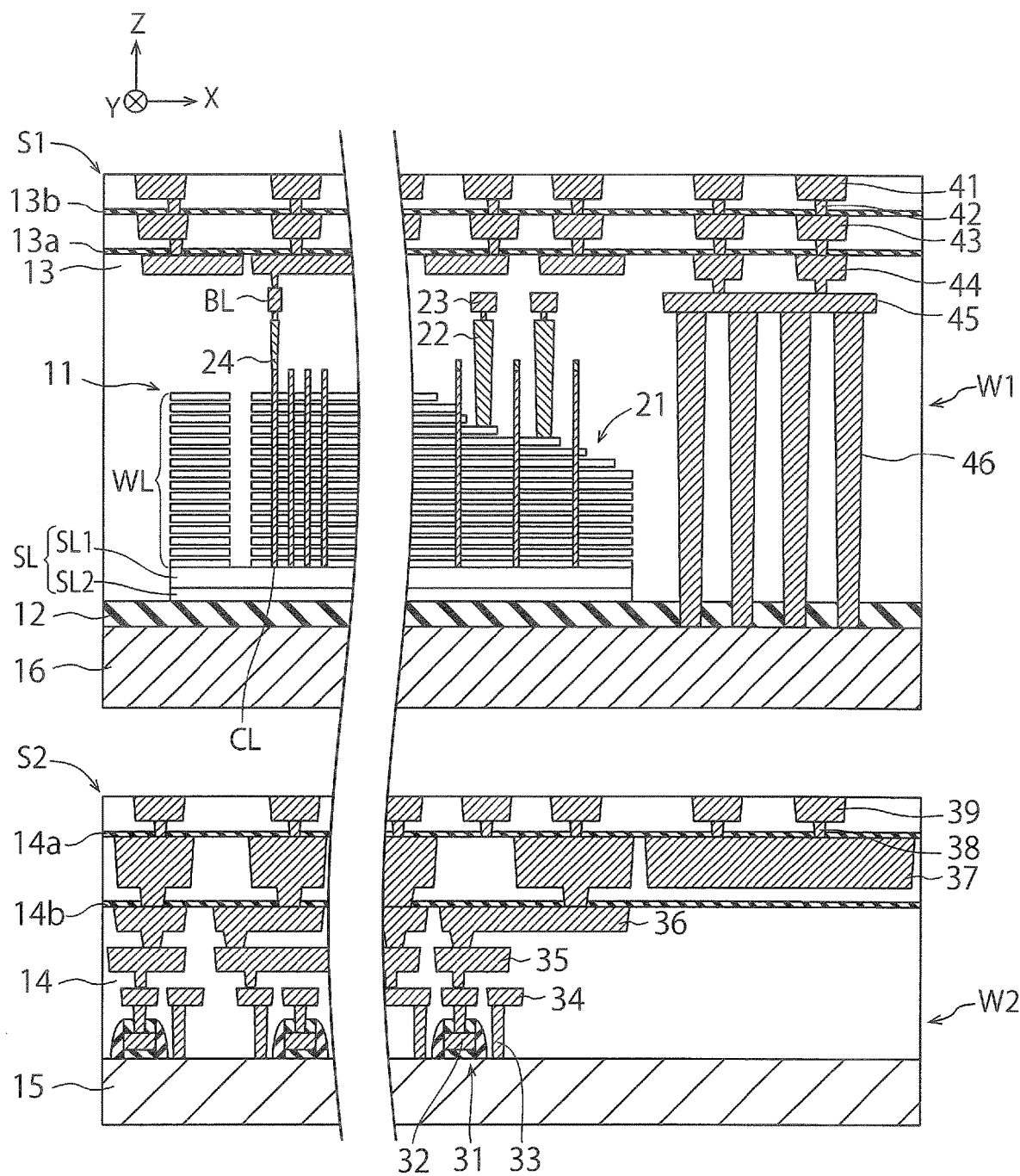
FIG. 11 is a sectional view showing a method of manufacturing the semiconductor device in the second embodiment.

FIG. 11 is a sectional view showing a method of manufacturing the semiconductor device in the second embodiment. FIG. 11 shows an array wafer W1 including a plurality of array regions C1 and a circuit wafer W2 including a plurality of circuit regions C2. The array wafer W1 is called memory wafer as well. The circuit wafer W2 is called CMOS wafer as well.

It should be noted that the direction of the array wafer W1 shown in FIG. 11 is opposite to the direction of the array region C1 shown in FIG. 9. In this embodiment, the array wafer W1 and the circuit wafer W2 are pasted together to manufacture the semiconductor device. FIG. 11 shows the array wafer W1 before the direction is reversed for the pasting. FIG. 9 shows the array region C1 after the direction is reversed for the pasting and the array region C1 is pasted and diced.

In FIG. 11, a sign S1 indicates the upper face of the array wafer W1 and a sign S2 indicates the upper face of the circuit wafer W2. It should be noted that the array wafer W1 includes a substrate 16 provided under the insulator 12. The substrate 16 is, for example, a semiconductor substrate such as an Si substrate.

In this embodiment, first, as shown in FIG. 11, the memory cell array 11, the insulator 12, the inter layer dielectric 13, the step structure portion 21, the metal pads 41, and the like are formed on the substrate 16 of the array wafer W1. The inter layer dielectric 14, the transistors 31, the metal pads 39, and the like are formed on the substrate 15 of the circuit wafer W2. For example, the via plugs 46, the interconnect layers 45 to 43, the via plugs 42, and the metal pads 41 are formed in order on the substrate 16. The contact plugs 33, the interconnect layers 34 to 37, the via plugs 38, and the metal pads 39 are formed in order on the substrate 15. Next, the array wafer W1 and the circuit wafer W2 are pasted together by a mechanical pressure. Consequently, the inter layer dielectric 13 and the inter layer dielectric 14 are bonded. Next, the array wafer W1 and the circuit wafer W2 are annealed at 400° C. Consequently, the metal pads 41 and the metal pads 39 are joined.

Thereafter, after the substrate 15 is thinned by the CMP and the substrate 16 is removed by the CMP, the array wafer W1 and the circuit wafer W2 are cut into a plurality of pieces. In this way, one piece including one array region C1 and one circuit region C2 is manufactured as the semiconductor device illustrated in FIG. 9. The metal pad 47 and the passivation film 48 are formed on the insulator 12, for example, after the thinning of the substrate 15 and the removal of the substrate 16.

Figure 12A:
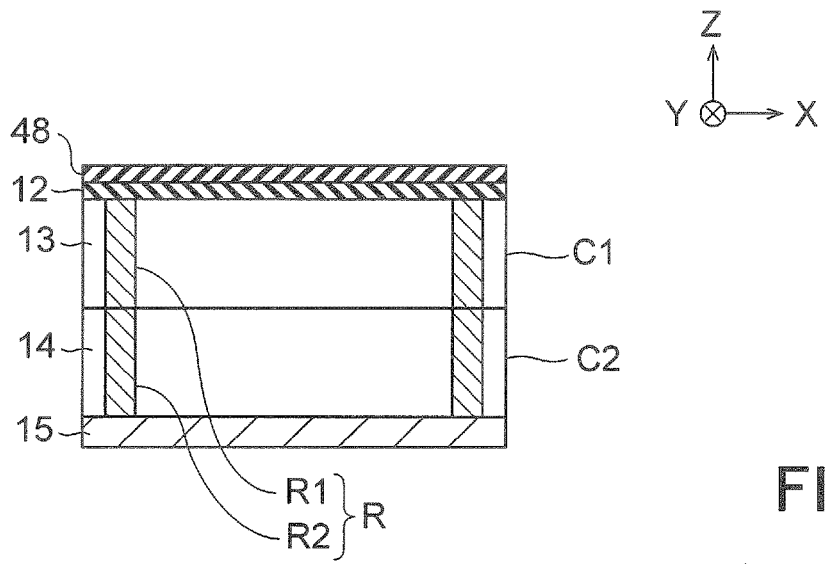
FIGS. 12A to 12C are sectional views showing structure in which a guard ring is provided in the semiconductor device in the second embodiment.
Figure 12B:
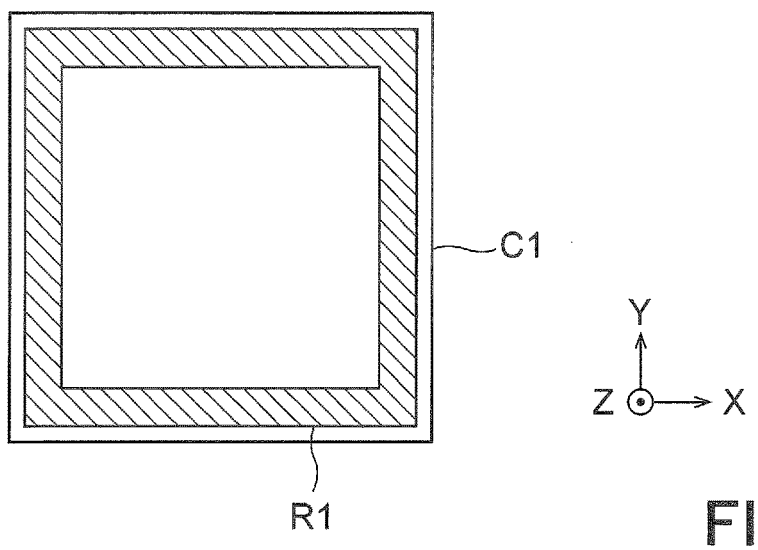
Figure 12C:
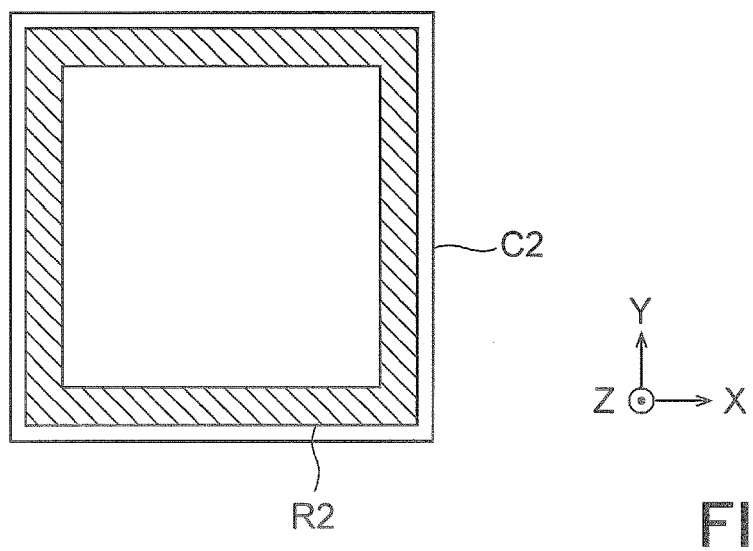

In this embodiment, the array wafer W1 and the circuit wafer W2 are pasted together. However, array wafers W1 may be pasted together instead. The content explained above with reference to FIGS. 9 to 11 and content explained below with reference to FIGS. 12A to 12C are applicable to pasting of the array wafers W1 as well.

FIG. 9 illustrates a boundary face between the inter layer dielectric 13 and the inter layer dielectric 14 and a boundary face between the metal pads 41 and the metal pads 39. In general, these boundary faces are not observed after the annealing. However, positions where the boundary faces are present can be estimated by, for example, detecting tilts of the side faces of the metal pads 41 and the side faces of the metal pads 39 and positional deviation between the side faces of the metal pads 41 and the metal pads 39.

In the following explanation, details of the SiCN films 13a, 13b, 14a, and 14b are explained continuously with reference to FIG. 11.

The interconnect layer 36 and the interconnect layer 37 in this embodiment are formed in the same manner as the lower interconnects 3 and the upper interconnects 4 in the first embodiment. Specifically, the SiCN film 14b is formed on the interconnect layer 36 and the interconnect layer 37 is formed on the interconnect layer 36 in the SiCN film 14b.

The interconnect layer 37, the via plugs 38, and the metal pads 39 in this embodiment are formed in the same manner as the lower interconnects 3 and the upper interconnects 4 in the first embodiment. Specifically, the SiCN film 14a is formed on the interconnect layer 37, the via plugs 38 are formed on the interconnect layer 37 in the SiCN film 14a, and the metal pads 39 are formed on the via plugs 38. The via plugs 38 and the metal pads 39 in this embodiment may be dual damascene interconnects like the upper interconnects 4 in the first embodiment.

The interconnect layer 44 and the interconnect layer 43 in this embodiment are formed in the same manner as the lower interconnects 3 and the upper interconnects 4 in the first embodiment. Specifically, the SiCN film 13a is formed on the interconnect layer 44. The interconnect layer 43 is formed on the interconnect layer 44 in the SiCN film 13a.

The interconnect layer 43, the via plugs 42, and the metal pads 41 in this embodiment are formed in the same manner as the lower interconnects 3 and the upper interconnects 4 in the first embodiment. Specifically, the SiCN film 13b is formed on the interconnect layer 43, the via plugs 42 are formed on the interconnect layer 43 in the SiCN film 13b, and the metal pads 41 are formed on the via plugs 42. The via plugs 42 and the metal pads 41 in this embodiment may be dual damascene interconnects like the upper interconnects 4 in the first embodiment.

In addition, the SiCN films 13a, 13b, 14a, and 14b in this embodiment are formed to have the same nature as the nature of the SiCN film 7a in the first embodiment. Accordingly, the contents of the Si—H groups and the Si—CH$_3$ groups in the SiCN films 13a, 13b, 14a, and 14b in this embodiment are respectively 6.0% or less and 0.5% or less. Accordingly, according to this embodiment, it is possible to prevent Cu atoms in the interconnect layers 36, 37, 43, and 44 from diffusing in the upward direction of the interconnect layers 36, 37, 43, and 44, reduce the capacitance among the interconnect layers, and suppress peeling of the SiCN films 13a, 13b, 14a, and 14b and occurrence of cracks.

In this embodiment, the inter layer dielectrics 13 and 14 in contact with the upper faces and the lower faces of the SiCN films 13a, 13b, 14a, and 14b are, for example, $SiO_2$ films. However, the inter layer dielectrics 13 and 14 in this embodiment may include the same SiN films as the SiN films 6a and 6b in the first embodiment near the boundary between a plug portion and an interconnect portion in the interconnect layer 37, near the boundary between the via plugs 38 and the metal pads 39, near the boundary between a plug portion and an interconnect portion in the interconnect layer 43, and near the boundary between the via plugs 42 and the metal pads 41. The inter layer dielectrics 13 and 14 in contact with the upper faces and the lower faces of the SiCN films 13a, 13b, 14a, and 14b may be $SiO_2$ films including C as an impurity element or may be SiC films or SiOC films.

The interconnect layers 36, 37, 43, and 44, the via plugs 38 and 42, and the metal pads 39 and 41 in this embodiment can be formed to include barrier metal layers and interconnect material layers like the lower interconnects 3 and the upper interconnects 4 in the first embodiment. In this case, an example of the barrier metal layer is a TaN film or a TiN film and an example of the interconnect material layer is a Cu layer.

It should be noted that the direction of the array wafer W1 shown in FIG. 11 is opposite to the direction of the array region C1 shown in FIG. 9. Accordingly, in FIG. 9, the SiCN film 13a is formed on the lower face of the interconnect layer 44 and the SiCN film 13b is formed on the lower face of the interconnect layer 43.

Second Embodiment and Guard Ring R

FIGS. 12A to 12C are sectional views showing structure in which a guard ring R is provided in the semiconductor device in the second embodiment. The guard ring R is an example of a ring portion.

Like FIG. 9, FIG. 12A shows, as the semiconductor device in this embodiment, a three-dimensional memory obtained by pasting together the array region C1 and the circuit region C2. However, in FIG. 12A, among the components shown in FIG. 9, illustration of the components other than the insulator 12, the inter layer dielectric 13, the inter layer dielectric 14, the substrate 15, and the passivation film 48 is omitted. FIG. 12B shows an XY section of the array region C1. FIG. 12C shows an XY section of the circuit region C2.

FIG. 12A shows the guard ring R provided in the array region C1 and the circuit region C2. The guard ring R is formed of metal and extends in a ring shape along an end face of the semiconductor device, that is, end faces of the array region C1 and the circuit region C2. The end faces of the array region C1 and the circuit region C2 are formed by side faces of the insulator 12, the inter layer dielectric 13, the inter layer dielectric 14, the substrate 15, the passivation film 48, and the like. Side faces of not-shown SiCN films 13a, 13b, 14a, and 14b included in the inter layer dielectrics 13 and 14 also form the end faces of the array region C1 and the circuit region C2 (see FIG. 9). The guard ring R includes a first portion R1 provided in the array region C1 and a second portion R2 provided in the circuit region C2. FIG. 12B shows an XY section of the first portion R1 extending in a ring shape along the end face of the array region C1. FIG. 12C shows an XY section of the second portion R2 extending in a ring shape along the end face of the circuit region C2. As shown in FIGS. 12B and 12C, the shape of the XY section of the end face of the array region C1 and the shape of the XY section of the end face of the circuit region C2 are a quadrangle (specifically, a square).

The semiconductor device in this embodiment may include the guard ring R or may not include the guard ring R. If the guard ring R is provided in the semiconductor device in this embodiment, it is possible to suppress films in the semiconductor device from peeling from one another. However, if the guard ring R is provided in the semiconductor device in this embodiment, treatment for forming the guard ring R is necessary. Additionally, an integration degree of the semiconductor device is deteriorated by the guard ring R.

Accordingly, the semiconductor device in this embodiment desirably does not include the guard ring R. Consequently, for example, the treatment for forming the guard ring R is unnecessary. The integration degree of the semiconductor device can be prevented from being deteriorated by the guard ring R. On the other hand, when the guard ring R is not provided in the semiconductor device in this embodiment, it is likely that the films in the semiconductor device peel from one another. For example, it is likely that the SiCN films (the SiCN films 13a, 13b, 14a, and 14b) peel from interconnects in contact with the SiCN films or from other insulators. However, the SiCN film in this embodiment is formed not to easily peel as explained above. Accordingly, according to this embodiment, it is possible to suppress peeling of the SiCN film and occurrence of cracks without providing the guard ring R.

The structure in which the guard ring R is not provided in the semiconductor device is applicable to not only a semiconductor device including a plurality of regions pasted to one another but also a semiconductor device including only one region not pasted to other regions. For example, the semiconductor device in the first embodiment may be configured by only one region. The guard ring R may not be provided in the region.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:
1. A semiconductor device, comprising:
a first etching stopper film;
a first insulator provided on the first etching stopper film and including an $SiO_2$ film, where Si represents silicon and O represents oxygen;
a first interconnect provided in the first etching stopper film and the first insulator and including a metal element;
a second insulator provided on the first insulator and the first interconnect and including Si, C (carbon) and N (nitrogen), content of Si—H groups (H represents hydrogen) in the second insulator being 6.0% or less, content of Si—CH$_3$ groups in the second insulator being 0.5% or less, the second insulator being in contact with an upper surface of the first interconnect;

a third insulator provided on the second insulator and including Si and O, the third insulator being in contact with the second insulator;
a second etching stopper film provided on the third insulator;
a fourth insulator provided on the second etching stopper film and including Si and O;
a first via plug provided on the first interconnect and provided in the second insulator and the third insulator; and
a second interconnect provided on the first via plug and provided in the second etching stopper film and the fourth insulator, and including the metal element.

2. The device of claim 1, wherein the content of the Si—H groups in the second insulator is 5.5% or less.

3. The device of claim 1, wherein a specific dielectric constant of the second insulator is 5.3 or less.

4. The device of claim 1, wherein a refractive index of the second insulator is 1.80 or more and 1.90 or less.

5. The device of claim 1, wherein the first interconnect includes Cu (copper) as the metal element.

6. The device of claim 5, wherein
the first interconnect includes a first metal layer provided in the first insulator and on a side face of the first insulator, and a second metal layer provided in the first insulator and on a side face and an upper face of the first metal layer, and
the second metal layer includes Cu (copper) as the metal element,
the first metal layer is included in the first etching stopper film, and
a bottom surface of the first etching stopper film and a bottom surface of the first metal layer has a distance in a first direction in which the first interconnect and the second interconnect stacked.

7. The device of claim 6, wherein the second insulator is provided on the first interconnect to be in contact with the second metal layer.

8. The device of claim 1, wherein the second interconnect includes Cu (copper) as the metal element.

9. The device of claim 1, further comprising:
a first region including a plurality of transistors provided on a substrate, the first insulator, the first interconnect, the second insulator and the second interconnect; and
a second region provided on the first region and including a memory cell array that includes a plurality of electrode layers stacked in a first direction and a plurality of semiconductor layers extending in the first direction in the plurality of electrode layers,
wherein the second region includes:
a fifth insulator including an $SiO_2$ film;
a third interconnect provided in the fifth insulator and formed of a material including a metal element that is identical with or different from the metal element in the first interconnect;
a sixth insulator provided under the fifth insulator and the third interconnect and including Si, C and N, content of the Si—H groups in the sixth insulator being 5.0% or less, content of the Si—$CH_3$ groups in the sixth insulator being 0.5% or less; and
a fourth interconnect provided under the third interconnect in the sixth insulator and formed of a material including a metal element that is identical with or different from the metal element in the second interconnect.

10. The device of claim 9, wherein
a plurality of metal pads are provided between the first region and the second region, and
the second interconnect and the fourth interconnect are electrically connected via at least one of the metal pads.

11. A method of manufacturing a semiconductor device, comprising:
forming a first etching stopper film;
forming, on the first etching stopper film, a first insulator including an $SiO_2$ film, where Si represents silicon and O represents oxygen;
forming, in the first etching stopper film and the first insulator, a first interconnect including a metal element;
forming, on the first insulator and the first interconnect, a second insulator including Si, C (carbon) and N (nitrogen), content of Si—H groups (H represents hydrogen) in the second insulator being 6.0% or less, content of Si—$CH_3$ groups in the second insulator being 0.5% or less, the second insulator being in contact with an upper surface of the first interconnect;
forming, on the second insulator, a third insulator including Si and O, the third insulator being in contact with the second insulator;
forming a second etching stopper film on the third insulator;
forming, on the second etching stopper film, a fourth insulator including Si and O;
forming a first via plug on the first interconnect and in the second insulator and the third insulator; and
forming, on the first via plug and in the second etching stopper film and the fourth insulator, a second interconnect including a metal element.

12. The method of claim 11, wherein the content of the Si—H groups in the second insulator is 5.5% or less.

13. The method of claim 11, wherein the second insulator is formed using a source gas including Si and a nitriding agent.

14. The method of claim 13, wherein a ratio of the flow rate of the source gas to the flow rate of the nitriding agent is set to 20% or less.

15. The method of claim 13, wherein the second insulator is formed by supplying an inert gas together with the source gas and the nitriding agent.

16. The method of claim 13, further comprising removing a native oxide film formed on a surface of the first interconnect,
wherein the second insulator is formed on the first insulator and the first interconnect after the removal of the native oxide film.

17. The method of claim 11, wherein the first interconnect is formed to include Cu (copper) as the metal element.

18. The method of claim 17, wherein
the first interconnect is formed to include a first metal layer provided in the first insulator, and a second metal layer provided on the first metal layer in the first insulator, and
the second metal layer is formed to include Cu (copper) as the metal element.

19. The method of claim 18, wherein the second insulator is provided on the first interconnect to be in contact with the second metal layer.

20. The method of claim 11, wherein the second interconnect is formed to include Cu (copper) as the metal element.

21. The device of claim 1, wherein the second insulator is an SiCN film.

* * * * *